(12) United States Patent
Read et al.

(10) Patent No.: US 9,941,183 B2
(45) Date of Patent: Apr. 10, 2018

(54) WALL MOUNTABLE CONNECTOR WITH WALL COVERING PLATE

(71) Applicant: HONEYWELL INTERNATIONAL INC., Morris Plains, NJ (US)

(72) Inventors: Travis Read, Little Canada, MN (US); David J. Emmons, Plymouth, MN (US); Steven L. Wolff, Hamel, MN (US); Eric Barton, Eden Prairie, MN (US)

(73) Assignee: Honeywell International Inc., Morris Plains, NJ (US)

( * ) Notice: Subject to any disclaimer, the term of this patent is extended or adjusted under 35 U.S.C. 154(b) by 26 days.

(21) Appl. No.: 15/042,796

(22) Filed: Feb. 12, 2016

(65) Prior Publication Data

US 2017/0236766 A1 Aug. 17, 2017

(51) Int. Cl.
*H01L 23/32* (2006.01)
*H01R 13/639* (2006.01)

(52) U.S. Cl.
CPC ......... *H01L 23/32* (2013.01); *H01R 13/6395* (2013.01)

(58) Field of Classification Search
CPC .............................. H01L 23/32; H01R 13/6395
See application file for complete search history.

(56) References Cited

U.S. PATENT DOCUMENTS

| 3,051,001 A | 8/1962 | Laviana et al. |
|---|---|---|
| 3,096,935 A | 7/1963 | Gibson |
| 3,152,851 A | 10/1964 | McLaughlin |
| 3,310,646 A | 3/1967 | Edwards |
| 3,999,732 A | 12/1976 | Stephens |
| 4,119,936 A | 10/1978 | Laviana et al. |
| 4,150,718 A | 4/1979 | Kolbow et al. |
| 4,295,180 A | 10/1981 | Herron et al. |
| 4,421,271 A | 12/1983 | Shavit |
| 4,587,403 A | 5/1986 | Shapess |
| 4,669,654 A | 6/1987 | Levine et al. |
| 4,998,085 A | 3/1991 | Johnson |
| 5,107,918 A | 4/1992 | McFarlane et al. |
| 5,485,954 A | 1/1996 | Guy et al. |

(Continued)

FOREIGN PATENT DOCUMENTS

| CA | 658329 | 2/1963 |
|---|---|---|
| CA | 772736 | 11/1967 |

(Continued)

OTHER PUBLICATIONS

The International Search Report for PCT Application Serial No. PCT/US2015/054208, dated Mar. 12, 2015.

(Continued)

*Primary Examiner* — William H Mayo, III
*Assistant Examiner* — Hiram E Gonzalez
(74) *Attorney, Agent, or Firm* — Seager, Tufte & Wickhem, LLP

(57) ABSTRACT

A wall mountable connector assembly with an optional wall covering plate is disclosed. The wall mountable connector provides electrical connections to each of a plurality of field wires and is configured to provide electrical connections to a thermostat secured to the wall mountable connector. The optional wall covering plate is configured to fit over the wall mountable connector and provide a pleasing appearance.

19 Claims, 43 Drawing Sheets

(56) References Cited

U.S. PATENT DOCUMENTS

| | | | |
|---|---|---|---|
| 5,592,989 A * | 1/1997 | Lynn | G05D 23/1902 165/259 |
| 5,729,442 A | 3/1998 | Frantz | |
| D402,569 S | 12/1998 | Papic et al. | |
| 6,102,749 A | 8/2000 | Lynn et al. | |
| 6,169,337 B1 | 1/2001 | Yoshida et al. | |
| 6,347,747 B1 | 2/2002 | Nesbitt | |
| 6,362,953 B1 | 3/2002 | Ohlwine et al. | |
| 6,888,441 B2 | 5/2005 | Carey | |
| 7,140,551 B2 | 11/2006 | De Pauw et al. | |
| 7,159,789 B2 | 1/2007 | Schwendinger et al. | |
| 7,161,483 B2 | 1/2007 | Chung | |
| 7,222,800 B2 | 5/2007 | Wruck | |
| 7,271,338 B1 | 9/2007 | Rohmer | |
| 7,344,422 B2 | 3/2008 | Helmreich | |
| 7,360,376 B2 | 4/2008 | Juntunen et al. | |
| D568,719 S | 5/2008 | Gorin et al. | |
| 7,569,777 B1 | 8/2009 | Gillam | |
| 7,617,988 B2 | 11/2009 | Morrow et al. | |
| 7,633,743 B2 | 12/2009 | Barton et al. | |
| 7,726,581 B2 | 6/2010 | Naujok et al. | |
| 7,832,652 B2 | 11/2010 | Barton et al. | |
| 7,938,336 B2 | 5/2011 | Rhodes et al. | |
| 8,089,032 B2 | 1/2012 | Beland et al. | |
| 8,262,422 B1 | 9/2012 | Chiang | |
| 8,364,319 B2 | 1/2013 | Roosli | |
| 8,511,576 B2 | 8/2013 | Warren et al. | |
| 8,511,577 B2 * | 8/2013 | Warren | F24F 11/0012 236/1 C |
| 8,708,242 B2 | 4/2014 | Connor et al. | |
| 8,727,611 B2 | 5/2014 | Huppi et al. | |
| 8,752,771 B2 | 6/2014 | Warren et al. | |
| 8,802,981 B2 * | 8/2014 | Wallaert | F24F 11/00 174/489 |
| 8,961,005 B2 | 2/2015 | Huppi et al. | |
| 9,026,232 B2 | 5/2015 | Fadell et al. | |
| 9,046,414 B2 | 6/2015 | Fadell et al. | |
| 9,092,039 B2 | 7/2015 | Fadell et al. | |
| 9,247,378 B2 | 1/2016 | Bisson et al. | |
| 9,282,654 B2 | 3/2016 | Bick et al. | |
| 9,419,361 B2 | 8/2016 | Daily et al. | |
| 9,423,805 B2 | 8/2016 | Novotny et al. | |
| 9,494,332 B2 | 11/2016 | Filson et al. | |
| 2005/0114234 A1 | 5/2005 | Thomas et al. | |
| 2005/0194457 A1 | 9/2005 | Dolan | |
| 2006/0192022 A1 | 8/2006 | Barton et al. | |
| 2010/0084482 A1 | 4/2010 | Kennedy et al. | |
| 2014/0062659 A1 | 3/2014 | Roosli et al. | |
| 2014/0190679 A1 | 7/2014 | Roosli et al. | |
| 2014/0226286 A1 | 8/2014 | Novotny et al. | |
| 2014/0268452 A1 | 9/2014 | Khoury et al. | |
| 2014/0268470 A1 | 9/2014 | Sapak et al. | |
| 2014/0319236 A1 | 10/2014 | Novotny et al. | |
| 2014/0321092 A1 | 10/2014 | Novotny et al. | |
| 2015/0096352 A1 | 4/2015 | Peterson et al. | |
| 2015/0104970 A1 * | 4/2015 | Smith | H01R 13/6275 439/373 |
| 2015/0144705 A1 | 5/2015 | Thiruvengada et al. | |
| 2015/0159903 A1 | 6/2015 | Marak et al. | |
| 2015/0327375 A1 | 11/2015 | Bick et al. | |
| 2016/0020590 A1 | 1/2016 | Roosli et al. | |
| 2016/0104981 A1 | 4/2016 | Mostoller et al. | |

FOREIGN PATENT DOCUMENTS

| | | |
|---|---|---|
| CA | 1249869 | 2/1989 |
| CA | 2062076 | 5/2000 |
| CN | 101180608 | 5/2008 |
| DE | 102012005465 B3 | 5/2013 |
| DE | 202013101582 U1 | 8/2014 |
| EP | 1622224 A1 | 2/2006 |
| FR | 2935201 A1 | 2/2010 |

OTHER PUBLICATIONS

Design U.S. Appl. No. 29/554,637, filed Feb. 12, 2016.
U.S. Appl. No. 15/042,397, filed Feb. 12, 2016.
U.S. Appl. No. 15/042,503, filed Feb. 12, 2016.
U.S. Appl. No. 15/042,584, filed Feb. 12, 2016.
U.S. Appl. No. 15/042,719, filed Feb. 12, 2016.
U.S. Appl. No. 15/042,866, filed Feb. 12, 2016.
U.S. Appl. No. 15/042,913, filed Feb. 12, 2016.
U.S. Appl. No. 15/042,941, filed Feb. 12, 2016.
U.S. Appl. No. 15/042,982, filed Feb. 12, 2016.
U.S. Appl. No. 15/042,990, filed Feb. 12, 2016.
U.S. Appl. No. 15/043,003, filed Feb. 12, 2016.
U.S. Appl. No. 15/043,015, filed Feb. 12, 2016.
U.S. Appl. No. 15/043,088, filed Feb. 12, 2016.
Enviromental Technologies, Inc., "Enviro-Tec ETST4H 2" Square Thermostat Mounting Instructions," 1 pages, downloaded Feb. 21, 2016.
Honeywell, "FocusPro 6000 Series Programmable Digital Thermostat, Installation Instructions," 24 pages, Mar. 2014.
Honeywell, "Heating/Cooling Thermostat and Subbase or Heating or Cooling Thermostat and Wallplate, T8195A,B/Q682 Owner's Manual," 24 pages, Dec. 1994.
Honeywell, "Lyric Installation Guide," 9 pages, downloaded Feb. 20, 2016.
Honeywell, "TB6575/TB8575 SuitePRO Digital Fan Coil Thermostats, Installation Instructions," 20 pages, Oct. 2013.
https://nest.com/support/pro/article/Help-with-Installation-and-set-up, "Nest Learning Thermostat Advanced Installation and Setup Help for Professional Installers," 22 pages, printed Feb. 20, 2016.
https://www.google.com/search?q=nest+sub+base&espv=2&biw=1032&bih=946&source=lnms&tbm=isch&sa=X&ved=0ahUKEwiNmea73YbLAhWJdR4KH . . . , "Thermostat Wall Plate—Google Search," 16 pages, printed Feb. 20, 2016.
https://www.google.com/search?q=nest+sub+base&espv=2&biw=1032&bih=946&source=lnms&tbm=isch&sa=X&ved=0ahUKEwiNmea73YbLAhWJdR4KH . . . , "Thermostat Subbase—Google Search," 28 pages, printed Feb. 20, 2016.
ICM Controls, "SC700V Non-Programmable Fan Coil Thermostat," 2 pages, downloaded Feb. 21, 2016.
Infineon, "TPM Key Backup and Recovery for Trusted Platforms," pp. 1-17, Sep. 21, 2006.
Lux, "WP567 LUX Universal Wallplate—Fits Thermostats TX500U, TX9100U, TX9600TS," available on Amazon.com, downloaded May 20, 2015.
Pro, "Heavy Duty Products for HVAC Professionals," 2 pages, downloaded Feb. 8, 2016.
Ritetemp, "Install Guide 6004," 7 pages, downloaded Feb. 21, 2016.
White-Rodgers, "F61-2XXX Adaptor Plate Assembly, Installation Instructions," 2 pages, downloaded Feb. 21, 2016.

* cited by examiner

US 9,941,183 B2

WALL MOUNTABLE CONNECTOR WITH WALL COVERING PLATE

TECHNICAL FIELD

The present disclosure pertains to Heating, Ventilation, and/or Air Conditioning (HVAC) systems. More particularly, the present disclosure pertains to HVAC controllers, such as thermostats, and devices for mounting such HVAC controllers to a wall.

BACKGROUND

Heating, Ventilation, and/or Air Conditioning (HVAC) systems are often used to control the comfort level within a building or other structure. Such HVAC systems typically include an HVAC controller that controls various HVAC components of the HVAC system in order to affect and/or control one or more environmental conditions within the building. In many cases, the HVAC controller is mounted to an internal wall of the building and provides control signals to various HVAC components of the HVAC system, sometimes via a number of control wires that extend through the wall. In some cases, the HVAC controller includes an HVAC controller head unit and a wall plate. During installation, the wall plate is typically mounted to an internal wall of the building, and the HVAC controller head unit is removably mounted to the wall plate. Improvements in the hardware, user experience, and functionality of such HVAC controllers would be desirable.

SUMMARY

The present disclosure pertains generally to a wall mountable connector assembly with an optional wall covering plate. The wall mountable connector is configured to provide an electrical connections to each of a plurality of field wires and is configured to provide electrical connections to a thermostat secured to the wall mountable connector. The optional wall covering plate is configured to fit over the wall mountable connector and provide a pleasing appearance by covering wall blemishes or the like.

In a particular example of the present disclosure, a wall mountable connector assembly includes an adapter plate that is configured to be secured relative to a wall and to accommodate a plurality of field wires exiting the wall. A wall mountable connector may have a first side facing the wall and a second opposing side. The wall mountable connector may be configured to be secured to the adapter plate with the first side of the wall mountable connector positioned adjacent the adapter plate. In some cases, the wall mountable connector may include a field wiring connection block that is configured to provide an electrical connection to the plurality of field wires and a thermostat terminal block that is configured to provide an electrical connection to a thermostat to be connected to the wall mountable connector. A wall covering plate may include a wall mountable connector aperture that is sized to allow the wall covering plate to be slipped over the second opposing side of the wall mountable connector and down to the adapter plate, wherein the wall covering plate may be configured to be secured to the adapter plate.

In another example of the present disclosure, a wall covering plate may be used in combination with a wall mountable connector that is mountable to an adapter plate. The wall covering plate may be configured to fit behind a thermostat that is connectable to the wall mountable connector and to cover wall blemishes from previous thermostat installations. The wall covering plate may include a back portion that is sized and configured to fit over an adapter plate such that an outer perimeter of the back portion hides the adapter plate from view and a front portion that includes a thermostat recess sized and configured to accommodate at least part of an outline of the thermostat to be connected to the wall mountable connector such that the thermostat fits into the thermostat recess in the front portion of the wall covering plate. A wall mountable connector aperture is formed through the wall covering plate and extends through the front portion and the back portion and is sized and configured to accommodate the wall mountable connector extending through the wall mountable connector aperture such that the wall covering plate can be secured relative to the wall mountable connector even after the wall mountable connector has been installed on the wall.

In some cases, the back portion of the wall covering plate includes tabs that are configured to fit into corresponding slots disposed on either side of the adapter plate in order to secure the wall covering plate to the adapter plate. In some cases, the wall mountable connector aperture provides a frictional fit with the wall mountable connector in order to secure the wall covering plate in position against the wall. In some instances, an adapter plate is not used, and the wall covering plate is secured in position against the wall at least in part by virtue of being captured between the wall and a back of the thermostat that is secured to the wall mountable connector, by adhesively securing the wall covering plate to the wall, or by friction fitting the wall covering plate to the wall mountable connector itself.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
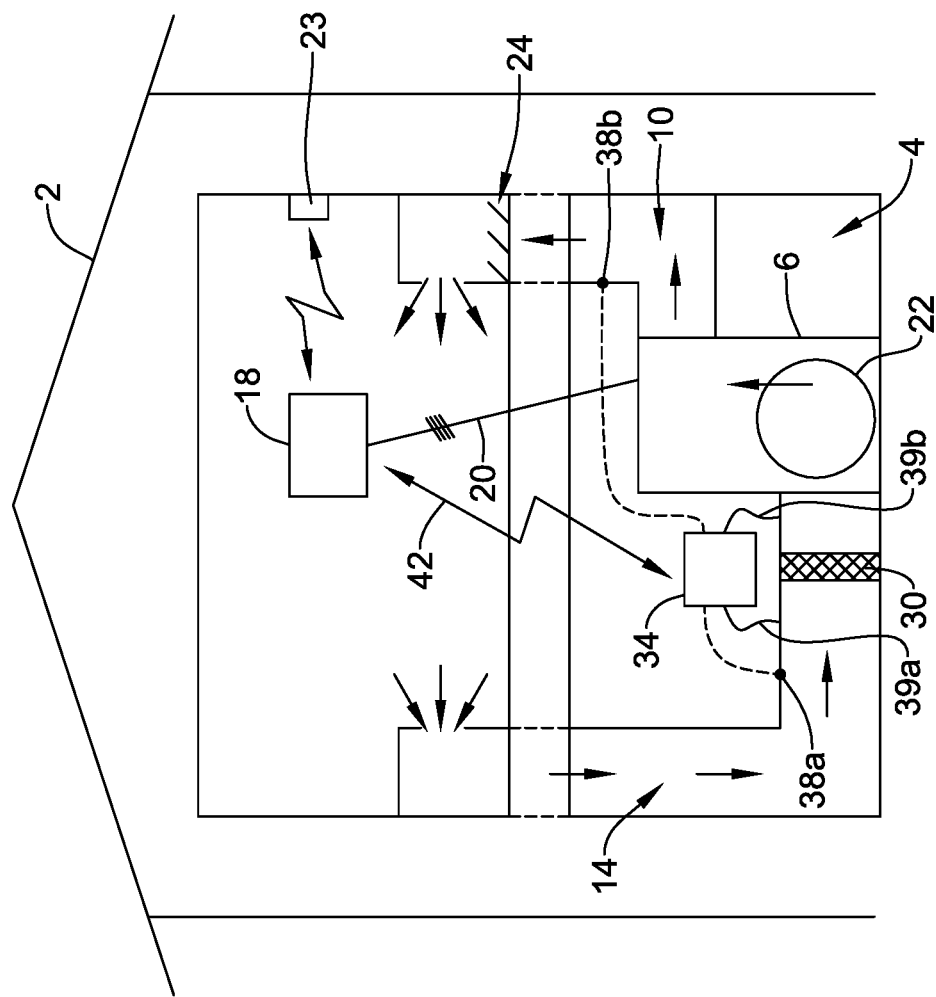
FIG. 1 is a schematic view of an illustrative HVAC system servicing a building or structure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

The present disclosure is directed generally at building automation systems. Building automation systems are systems that control one or more operations of a building. Building automation systems can include HVAC systems, security systems, fire suppression systems, energy management systems and other systems. While HVAC systems with HVAC controllers are used as an example below, it should be recognized that the concepts disclosed herein can be applied to building automation systems more generally.

FIG. 1 is a schematic view of a building 2 having an illustrative heating, ventilation, and air conditioning (HVAC) system 4. While FIG. 1 shows a typical forced air type HVAC system, other types of HVAC systems are contemplated including, but not limited to, boiler systems, radiant heating systems, electric heating systems, cooling systems, heat pump systems, and/or any other suitable type of HVAC system, as desired. The illustrative HVAC system 4 of FIG. 1 includes one or more HVAC components 6, a system of ductwork and air vents including a supply air duct 10 and a return air duct 14, and one or more HVAC controllers 18. The one or more HVAC components 6 may include, but are not limited to, a furnace, a heat pump, an electric heat pump, a geothermal heat pump, an electric heating unit, an air conditioning unit, a humidifier, a dehumidifier, an air exchanger, an air cleaner, a damper, a valve, and/or the like.

It is contemplated that the HVAC controller(s) 18 may be configured to control the comfort level in the building or structure by activating and deactivating the HVAC component(s) 6 in a controlled manner. The HVAC controller(s) 18 may be configured to control the HVAC component(s) 6 via a wired or wireless communication link 20. In some cases, the HVAC controller(s) 18 may be a thermostat, such as, for example, a wall mountable thermostat, but this is not required in all embodiments. Such a thermostat may include (e.g. within the thermostat housing) or have access to one or more temperature sensor(s) for sensing ambient temperature at or near the thermostat. In some instances, the HVAC controller(s) 18 may be a zone controller, or may include multiple zone controllers each monitoring and/or controlling the comfort level within a particular zone in the building or other structure.

In the illustrative HVAC system 4 shown in FIG. 1, the HVAC component(s) 6 may provide heated air (and/or cooled air) via the ductwork throughout the building 2. As illustrated, the HVAC component(s) 6 may be in fluid communication with every room and/or zone in the building 2 via the ductwork 10 and 14, but this is not required. In operation, when a heat call signal is provided by the HVAC controller(s) 18, an HVAC component 6 (e.g. forced warm air furnace) may be activated to supply heated air to one or more rooms and/or zones within the building 2 via supply air ducts 10. The heated air may be forced through supply air duct 10 by a blower or fan 22. In this example, the cooler air from each zone may be returned to the HVAC component 6 (e.g. forced warm air furnace) for heating via return air ducts 14. Similarly, when a cool call signal is provided by the HVAC controller(s) 18, an HVAC component 6 (e.g. air conditioning unit) may be activated to supply cooled air to one or more rooms and/or zones within the building or other structure via supply air ducts 10. The cooled air may be forced through supply air duct 10 by the blower or fan 22. In this example, the warmer air from each zone may be returned to the HVAC component 6 (e.g. air conditioning unit) for cooling via return air ducts 14. In some cases, the HVAC system 4 may include an internet gateway or other device 23 that may allow one or more of the HVAC components, as described herein, to communicate over a wide area network (WAN) such as, for example, the Internet.

In some cases, the system of vents or ductwork 10 and/or 14 can include one or more dampers 24 to regulate the flow of air, but this is not required. For example, one or more dampers 24 may be coupled to one or more HVAC controller(s) 18, and can be coordinated with the operation of one or more HVAC components 6. The one or more HVAC controller(s) 18 may actuate dampers 24 to an open position, a closed position, and/or a partially open position to modulate the flow of air from the one or more HVAC components to an appropriate room and/or zone in the building or other structure. The dampers 24 may be particularly useful in zoned HVAC systems, and may be used to control which zone(s) receives conditioned air from the HVAC component(s) 6.

In many instances, one or more air filters 30 may be used to remove dust and other pollutants from the air inside the building 2. In the illustrative example shown in FIG. 1, the air filter(s) 30 is installed in the return air duct 14, and may filter the air prior to the air entering the HVAC component 6, but it is contemplated that any other suitable location for the air filter(s) 30 may be used. The presence of the air filter(s) 30 may not only improve the indoor air quality, but may also protect the HVAC components 6 from dust and other particulate matter that would otherwise be permitted to enter the HVAC component.

In some cases, and as shown in FIG. 1, the illustrative HVAC system 4 may include an equipment interface module (EIM) 34. When provided, the equipment interface module 34 may, in addition to controlling the HVAC under the direction of the thermostat, be configured to measure or detect a change in a given parameter between the return air side and the discharge air side of the HVAC system 4. For example, the equipment interface module 34 may measure a difference in temperature, flow rate, pressure, or a combination of any one of these parameters between the return air side and the discharge air side of the HVAC system 4. In some cases, the equipment interface module 34 may be adapted to measure the difference or change in temperature (delta T) between a return air side and discharge air side of the HVAC system 4 for the heating and/or cooling mode. The delta T for the heating and cooling modes may be calculated by subtracting the return air temperature from the discharge air temperature (e.g. delta T=discharge air temperature−return air temperature)

In some cases, the equipment interface module 34 may include a first temperature sensor 38a located in the return (incoming) air duct 14, and a second temperature sensor 38b located in the discharge (outgoing or supply) air duct 10. Alternatively, or in addition, the equipment interface module 34 may include a differential pressure sensor including a first pressure tap 39a located in the return (incoming) air duct 14, and a second pressure tap 39b located downstream of the air filter 30 to measure a change in a parameter related to the amount of flow restriction through the air filter 30. In some cases, the equipment interface module 34, when provided, may include at least one flow sensor that is capable of providing a measure that is related to the amount of air flow restriction through the air filter 30. In some cases, the equipment interface module 34 may include an air filter monitor. These are just some examples.

When provided, the equipment interface module 34 may be configured to communicate with the HVAC controller 18 via, for example, a wired or wireless communication link 42. In other cases, the equipment interface module 34 may be incorporated or combined with the HVAC controller 18. In some instances, the equipment interface module 34 may communicate, relay or otherwise transmit data regarding the selected parameter (e.g. temperature, pressure, flow rate, etc.) to the HVAC controller 18. In some cases, the HVAC controller 18 may use the data from the equipment interface module 34 to evaluate the system's operation and/or performance. For example, the HVAC controller 18 may compare data related to the difference in temperature (delta T) between the return air side and the discharge air side of the HVAC system 4 to a previously determined delta T limit stored in the HVAC controller 18 to determine a current operating performance of the HVAC system 4.

Figure 2:
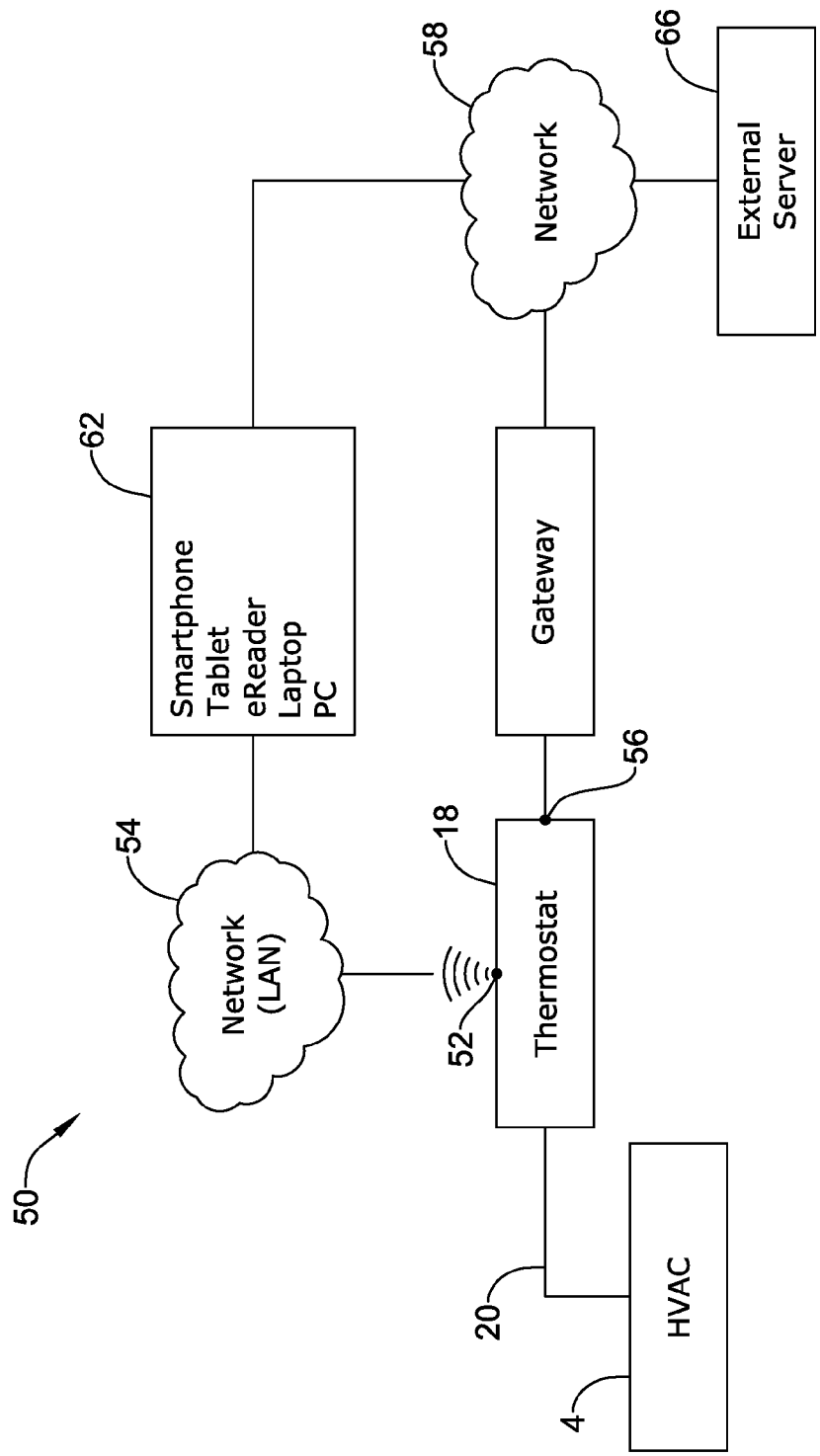
FIG. 2 is a schematic view of an illustrative HVAC control system that may facilitate access and/or control of the HVAC system of FIG. 1.

FIG. 2 is a schematic view of an illustrative HVAC control system 50 that facilitates remote access and/or control of the illustrative HVAC system 4 shown in FIG. 1. The HVAC control system 50 may be considered a building automation system or part of a building automation system. The illustrative HVAC control system 50 includes an HVAC controller, as for example, HVAC controller 18 (see FIG. 1) that is configured to communicate with and control one or more HVAC components 6 of the HVAC system 4. As discussed above, the HVAC controller 18 may communicate with the one or more HVAC components 6 of the HVAC system 4 via a wired or wireless link 20. Additionally, the HVAC controller 18 may communicate over one or more wired or wireless networks that may accommodate remote access and/or control of the HVAC controller 18 via another device such as a smart phone, tablet, e-reader, laptop computer, personal computer, key fob, or the like. As shown in FIG. 2, the HVAC controller 18 may include a first communications port 52 for communicating over a first network 54, and in some cases, a second communications port 56 for communicating over a second network 58. In some cases, the first network 54 may be a wireless local area network (LAN), and the second network 58 (when provided) may be a wide area network or global network (WAN) including, for example, the Internet. In some cases, the wireless local area network 54 may provide a wireless access point and/or a network host device that is separate from the HVAC controller 18. In other cases, the wireless local area network 54 may provide a wireless access point and/or a network host device that is part of the HVAC controller 18. In some cases, the wireless local area network 54 may include a local domain name server (DNS), but this is not required for all embodiments. In some cases, the wireless local area network 54 may be an ad-hoc wireless network, but this is not required.

In some cases, the HVAC controller 18 may be programmed to communicate over the second network 58 with an external web service hosted by one or more external web server(s) 66. A non-limiting example of such an external web service is Honeywell's TOTAL CONNECT™ web service. The HVAC controller 18 may be configured to upload selected data via the second network 58 to the external web service where it may be collected and stored on the external web server 66. In some cases, the data may be indicative of the performance of the HVAC system 4. Additionally, the HVAC controller 18 may be configured to receive and/or download selected data, settings and/or services sometimes including software updates from the external web service over the second network 58. The data, settings and/or services may be received automatically from the web service, downloaded periodically in accordance with a control algorithm, and/or downloaded in response to a user request. In some cases, for example, the HVAC controller 18 may be configured to receive and/or download an HVAC operating schedule and operating parameter settings such as, for example, temperature set points, humidity set points, start times, end times, schedules, window frost protection settings, and/or the like from the web server 66 over the second network 58. In some instances, the HVAC controller 18 may be configured to receive one or more user profiles having at least one operational parameter setting that is selected by and reflective of a user's preferences. In still other instances, the HVAC controller 18 may be configured to receive and/or download firmware and/or hardware updates such as, for example, device drivers from the web server 66 over the second network 58. Additionally, the HVAC controller 18 may be configured to receive local weather data, weather alerts and/or warnings, major stock index ticker data, traffic data, and/or news headlines over the second network 58. These are just some examples.

Depending upon the application and/or where the HVAC user is located, remote access and/or control of the HVAC controller 18 may be provided over the first network 54 and/or the second network 58. A variety of remote wireless devices 62 may be used to access and/or control the HVAC controller 18 from a remote location (e.g. remote from the HVAC Controller 18) over the first network 54 and/or second network 58 including, but not limited to, mobile phones including smart phones, tablet computers, laptop or personal computers, wireless network-enabled key fobs, e-readers, and/or the like. In many cases, the remote wireless devices 62 are configured to communicate wirelessly over the first network 54 and/or second network 58 with the HVAC controller 18 via one or more wireless communication protocols including, but not limited to, cellular communication, ZigBee, REDLINK™, Bluetooth, WiFi, IrDA, dedicated short range communication (DSRC), EnOcean, and/or any other suitable common or proprietary wireless protocol, as desired.

In some cases, an application program code (i.e. app) stored in the memory of the remote device 62 may be used to remotely access and/or control the HVAC controller 18. The application program code (app) may be downloaded from an external web service, such as the web service hosted by the external web server 66 (e.g. Honeywell's TOTAL CONNECT™ web service) or another external web service (e.g. ITUNES® or Google Play). In some cases, the app may provide a remote user interface for interacting with the HVAC controller 18 at the user's remote device 62. For example, through the user interface provided by the app, a user may be able to change operating parameter settings such as, for example, temperature set points, humidity set points, start times, end times, schedules, window frost protection settings, accept software updates and/or the like. Communications may be routed from the user's remote device 62 to the web server 66 and then, from the web server 66 to the HVAC controller 18. In some cases, communications may flow in the opposite direction such as, for example, when a user interacts directly with the HVAC controller 18 to change an operating parameter setting such as, for example, a schedule change or a set point change. The change made at the HVAC controller 18 may be routed to the web server 66 and then from the web server 66 to the remote device 62 where it may reflected by the application program executed by the remote device 62.

In some cases, a user may be able to interact with the HVAC controller 18 via a user interface provided by one or more web pages served up by the web server 66. The user may interact with the one or more web pages using a variety of internet capable devices to effect a setting or other change at the HVAC controller 18, and in some cases view usage data and energy consumption data related to the usage of the HVAC system 4. In some cases, communication may occur between the user's remote device 62 and the HVAC controller 18 without being relayed through a server such as external server 66. These are just some examples.

Figure 3:
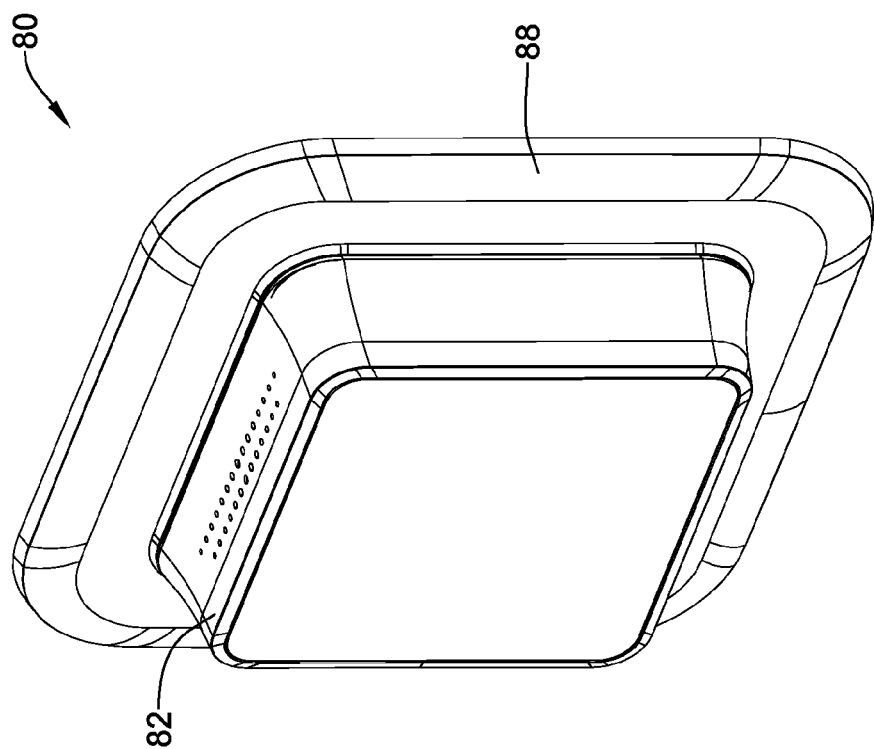
FIG. 3 is a perspective view of an illustrative thermostat assembly that may be used in the HVAC control system of FIG. 2.
Figure 4:
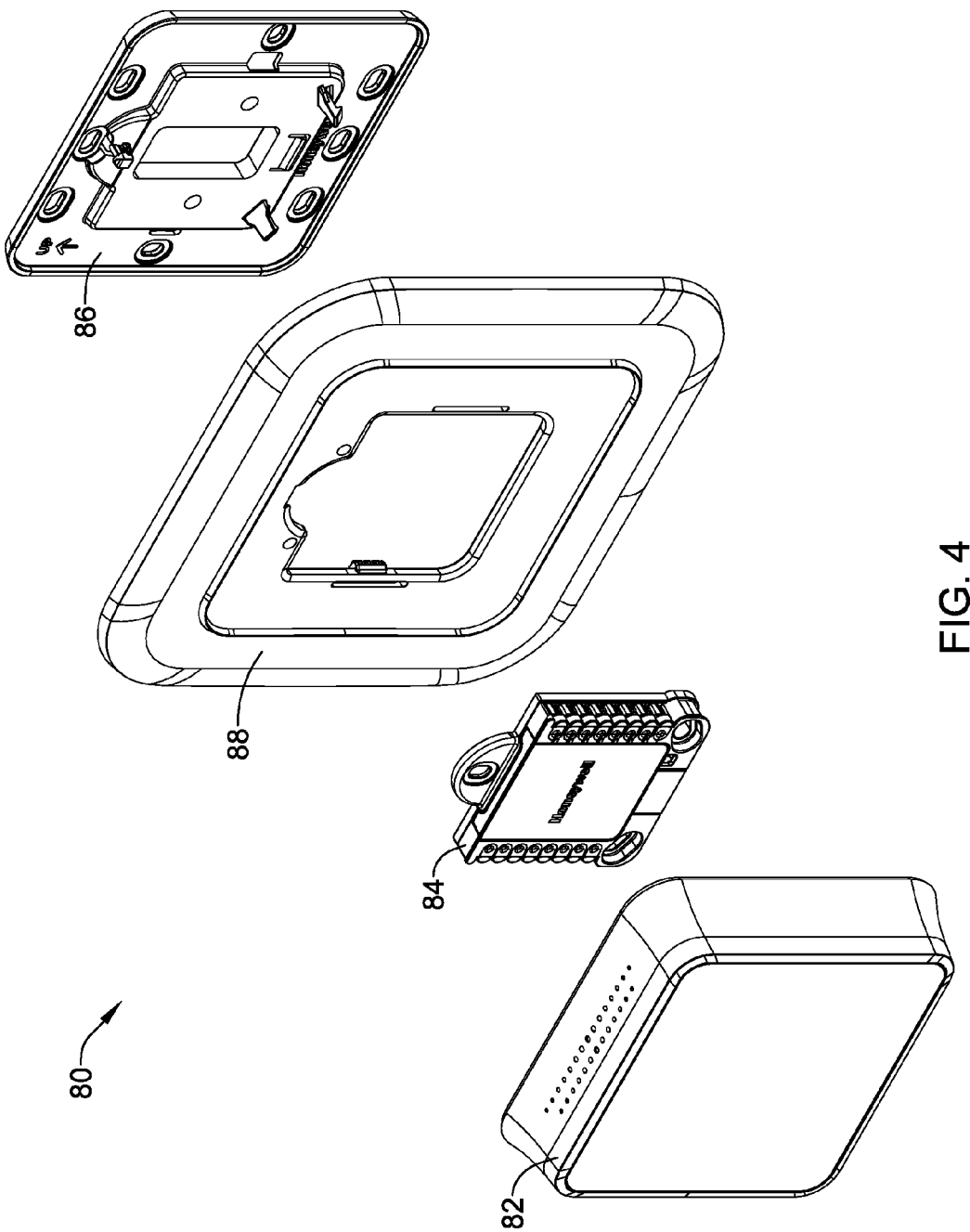
FIG. 4 is an exploded perspective view of the illustrative thermostat assembly of FIG. 3.

FIG. 3 is a perspective view of an illustrative thermostat assembly 80, and FIG. 4 is an exploded perspective view of the illustrative thermostat assembly 80 of FIG. 3. In some instances, the thermostat assembly 80 may be considered as an example of the HVAC controller 18 referenced in FIGS. 1 and 2. In some instances, and with particular reference to FIG. 4, the thermostat assembly 80 may include a thermostat 82 and a wall mountable connector 84. As will be illustrated, the wall mountable connector 84 may be configured to accommodate field wires that enter from a rear of the wall mountable connector 84. When so provided, the wall mountable connector 84 may provide an electrical connection between terminals of the thermostat 82 and field wires (not illustrated) of the HVAC system 4 (FIGS. 1 and 2).

In the example shown, the wall mountable connector 84 also provides a mechanical connection to the thermostat 82 and thus may be used to secure the thermostat 82 in place relative to a vertical surface such as a wall. The wall mountable connector 84 may be considered as being a fully integrated connector, providing electrical and mechanical connections to the thermostat 82 in a compact design that is small enough to be used with a variety of different thermostats and yet affords the ability to easily connect a plurality of field wires to the wall mountable connector 84.

In some instances, the wall mountable connector 84 itself may be secured to an adapter plate 86 that is configured to be secured to an electrical junction box or the like (not illustrated) disposed within the wall. In some cases, the adapter plate 86 may not be used, particularly if the field wires simply exit the wall through a hole in the wall. In some cases, an installer may utilize the adaptor plate 86 if there is a large hole in the wall through which the field wires exit, even if there is no junction box within the wall.

In some cases, a wall covering plate 88 may be included to provide an aesthetically pleasing appearance to the thermostat assembly 80. In some instances, for example, the wall covering plate 88 may be larger than the thermostat 82 and may hide blemishes left on the wall from previous thermostat installations. In some cases, a homeowner may, for example, decide they want to install a wall covering plate 88 that has a different shape or design, or perhaps is a different color to match the color of a new thermostat. Additional details regarding the thermostat 82, the wall mountable connector 84, the adapter plate 86 and the wall covering plate 88, as well as particular interactions between the thermostat 82 and the wall mountable connector 84, between the wall mountable connector 84 and the adapter plate 86 and between the wall mountable connector 84 and the wall covering plate 88 will each be described in more detail with respect to subsequent Figures.

Figure 5:
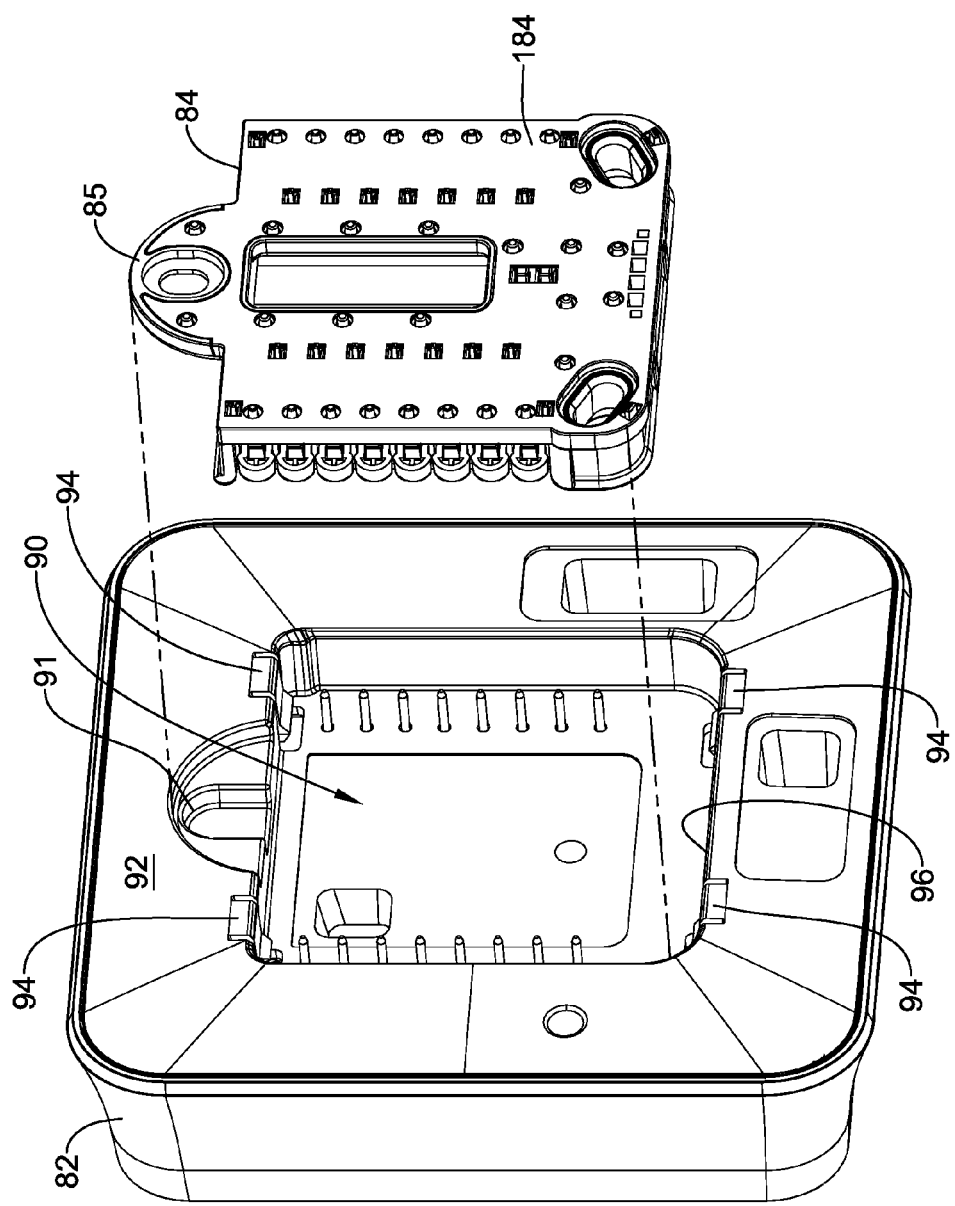
FIG. 5 is a rear exploded perspective view of a thermostat and wall mountable connector forming a part of the illustrative thermostat assembly of FIG. 3.
Figure 6:
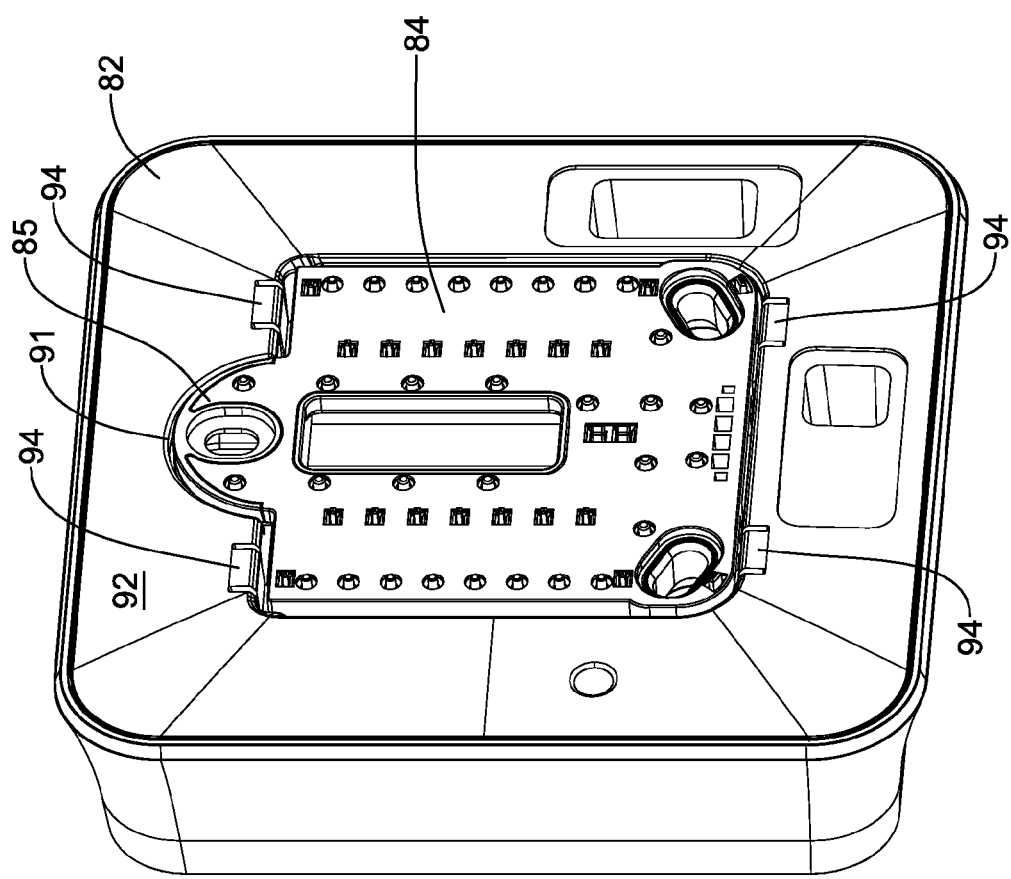
FIG. 6 is a rear view of the thermostat and wall mountable connector of FIG. 5, showing the wall mountable connector nestled within the thermostat.

FIGS. 5 and 6 provide some details of the interaction between the thermostat 82 and the wall mountable connector 84. FIG. 5 is an exploded perspective view showing the wall mountable connector 84 positioned behind the thermostat 82 (or showing the thermostat 82 in front of the wall mountable connector 84), while FIG. 6 shows the wall mountable connector 84 nestled into a recess 90 in the back of the thermostat 82. In the example shown, the wall mountable connector 84 is sized and configured to fit within recess 90 that is formed within a back side 92 of the thermostat 82. In some cases, the wall mountable connector 84 may include a mounting tab 85 extending upward from the wall mountable connector 84, and the recess 90 may include a corresponding recessed portion 91 to accommodate the mounting tab 85. FIG. 6 shows the wall mountable connector 84 positioned and secured within the recess 90. In some cases, at least 90 percent of the volume of the wall mountable connector 84 fits within the recess 90. In some cases, at least 95 percent of the volume of the wall mountable connector 84 fits within the recess 90. In some cases, at least 98 percent of the volume of the wall mountable connector 84 fits within the recess 90. In some cases, 100 percent of the volume of the wall mountable connector 84 fits within the recess 90. In some cases, when the wall mountable connector 84 is mounted to a wall, the back side 92 of the thermostat 82 may extend nearly to the wall, such as to less than 10 millimeters from the wall, to less than 5 millimeters from the wall, to less than 2 millimeters from the wall, to less than 1 millimeter from the wall, or less.

In some cases, and as will be discussed in greater detail with respect to subsequent Figures, the thermostat 82 may include one or more latches 94 that are each disposed within a side wall 96 of the recess 90. As illustrated, there are a pair of latches 94 disposed along an upper side of the recess 90 and a pair of latches 94 that are disposed along a lower side of the recess 90. In some cases, there may be fewer than a total of four latches 94. In some cases, there may be more than four latches 94. In some cases, at least some of the latches 94 may be disposed along one or both sides of the recess 90. Regardless of how many latches 94 are included, it will be appreciated that the latches 94 will help secure the thermostat 82 to the wall mountable connector 84. The thermostat 82 is also mechanically secured to the wall mountable connector 84, in part, via interactions between a plurality of electrical pins 98 extending into the recess 90 and corresponding pin terminals formed within the wall mountable connector 84. These will be discussed in greater detail with respect to subsequent Figures.

Figure 7:
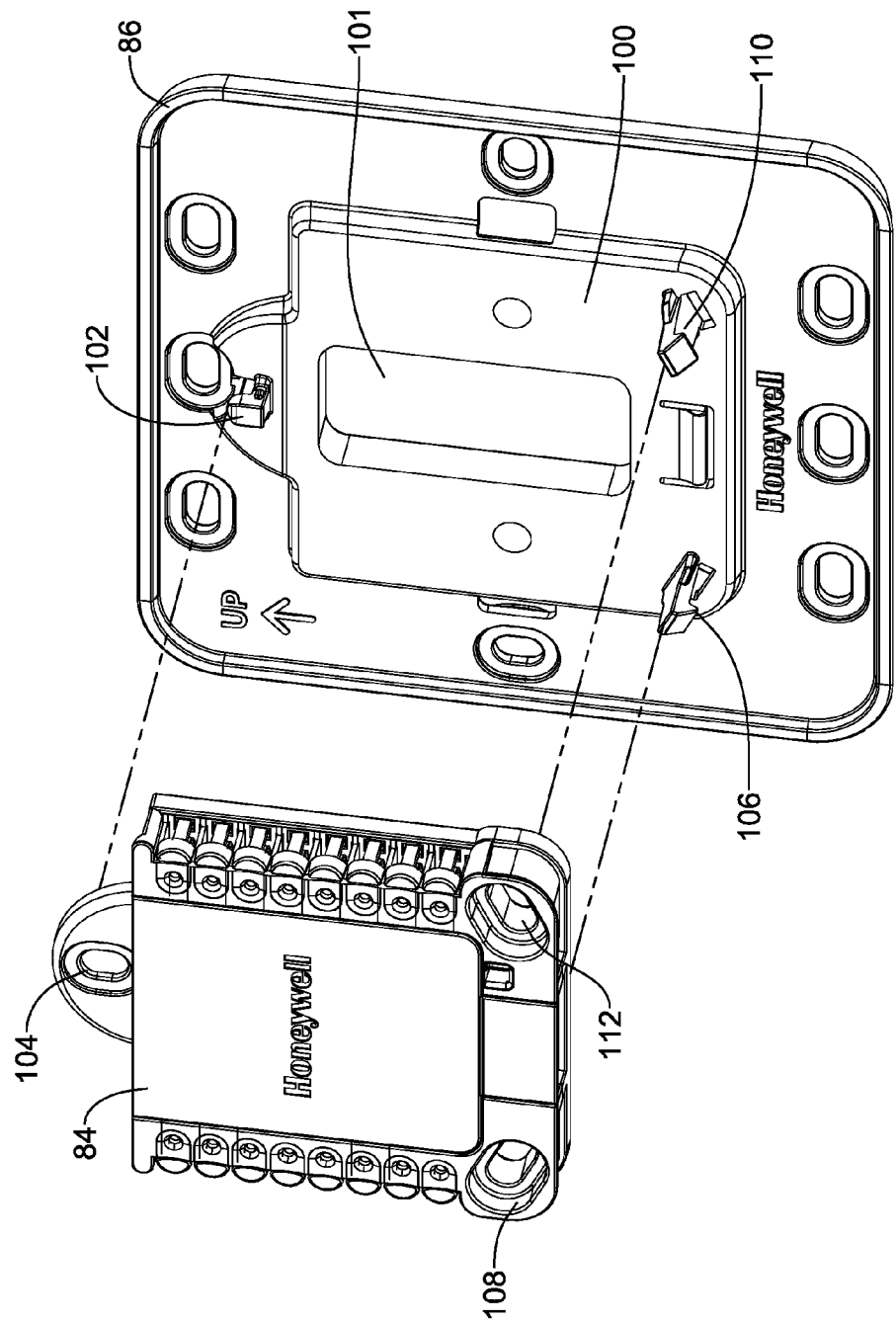
FIG. 7 is an exploded perspective view of a wall mountable connector and an adapter plate forming a part of the illustrative thermostat assembly of FIG. 3.
Figure 8:
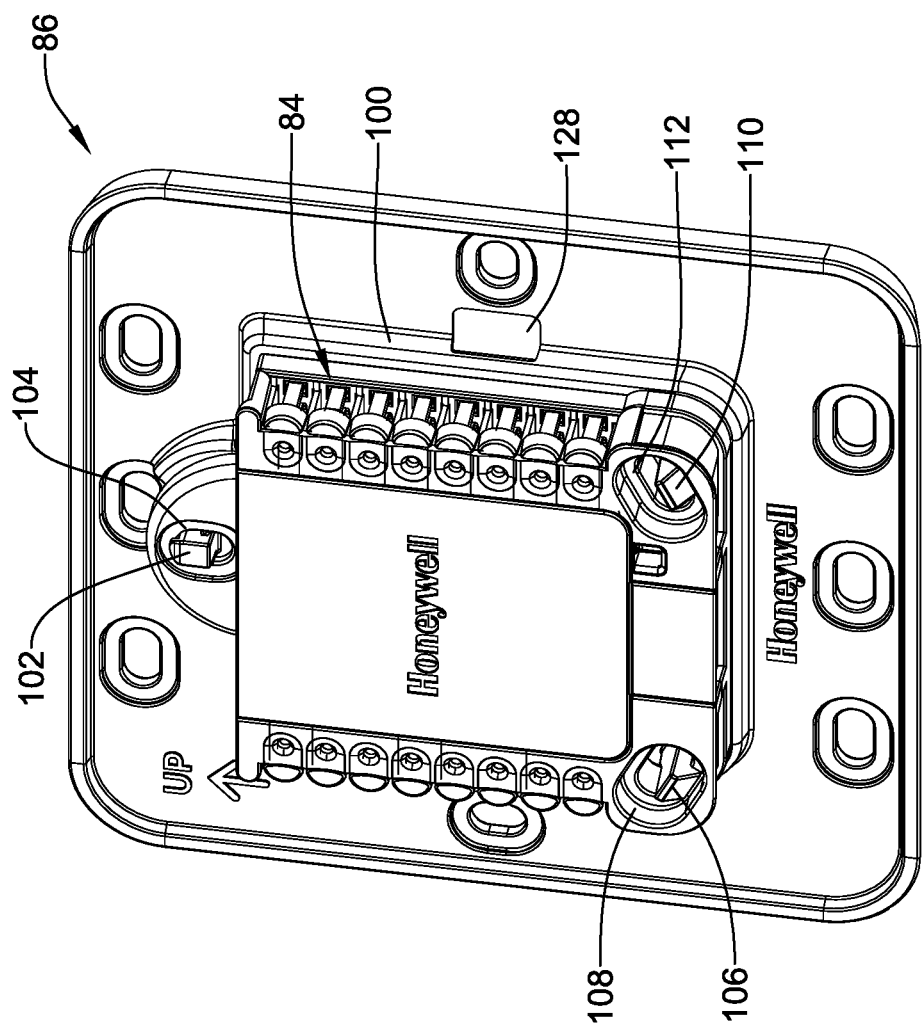
FIG. 8 is a perspective view of the wall mountable connector and adapter plate of FIG. 7, showing the wall mountable connector secured relative to the adapter plate.

FIGS. 7 and 8 provide details of the interaction between the wall mountable connector 84 and the optional adapter plate 86. FIG. 7 is an exploded perspective view showing the wall mountable connector 84 disposed above or in front of the adapter plate 86, while FIG. 8 shows the wall mountable connector 84 secured against the front of the adapter plate 86. In some cases, as illustrated, the adapter plate 86 may include a raised portion 100 (see FIG. 7) that has a shape that corresponds to an outer profile of the wall mountable connector 84. The adapter plate 86 may also include a field wire aperture 101 that permits field wires extending from a junction box (not illustrated) or the like, through the adapter plate 86, and into the wall mountable connector 84. FIG. 8 shows the wall mountable connector 84 engaged against the raised portion 100 of the adapter plate 86. In some instances, the raised portion 100 of the adapter plate 86 may include mounting latches that correspond to mounting apertures formed within the wall mountable connector 84. In some cases, the raised portion 100 includes an upper mounting latch 102 that is configured to engage a corresponding upper mounting feature formed in the mounting tab 85 of the wall mountable connector 84 such as an upper mounting aperture 104. In the example shown, a first lower mounting latch 106 is configured to engage a corresponding first lower mounting feature such as a first lower mounting aperture 108 formed in the wall mountable connector 84. Similarly, a second lower mounting latch 110 is configured to engage a corresponding second lower mounting feature such as a second lower mounting aperture 112 formed in the wall mountable connector 84.

Figure 9:
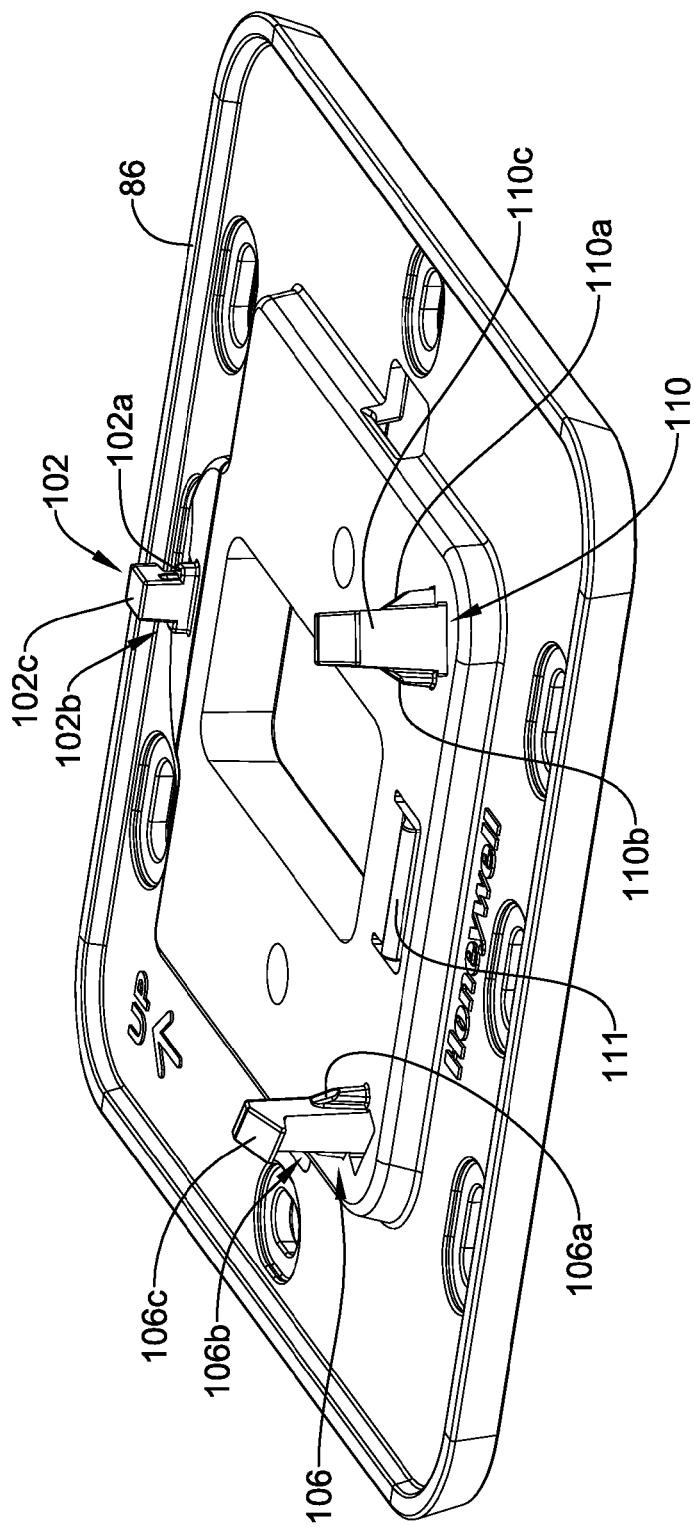
FIG. 9 is a perspective view of the adapter plate.

FIG. 9 shows additional features of the illustrative adapter plate 86. In some cases, the adaptor plate 86 is molded from a polymer or other material that is transparent or at least substantially transparent to RF energy. As a result, the adaptor plate 86 does not block communication signals such as WiFi being transmitted to or from the thermostat 82. In some cases, the mounting latch 102, for example, may include a first crush rib 102*a* and a second crush rib 102*b* that fit into a corresponding mounting aperture 104 in the wall mountable connector 84. The first crush rib 102*a* and the second crush rib 102*b*, in combination, span a distance across the mounting aperture 104 and in some cases at least partially compress or otherwise deform when the wall mountable connector 84 is mounted to the adaptor plate 86 in order to reduce or eliminate backlash in the X direction. The mounting latch 102 also includes a latch portion 102*c* extending from the first crush rib 102*a* and the second crush rib 102*b* that is configured to engage a front surface of the wall mountable connector 84. Also, the mounting latch 106 may include a first crush rib 106a and a second crush rib 106b that fit into a corresponding mounting aperture 108 in the wall mountable connector 84, and a latch portion 106c that extends up from the first crush rib 106a and the second crush rib 106b, and that is configured to engage a front surface of the wall mountable connector 84. Likewise, the mounting latch 110 may include a first crush rib 110a and a second crush rib 110b that fit into a corresponding mounting aperture 112 in the wall mountable connector 84, and a latch portion 110c that extends up from the first crush rib 110a and the second crush rib 110b, and that is configured to engage a front surface of the wall mountable connector 84. In some cases, the latch portion 102c, 106c, and 110c may engage a reduced height shoulder portions 104a, 108a, 112a of the corresponding mounting apertures 104, 108, 112 (see FIG. 17). In some cases, the adaptor plate 86 includes a tab 111 that engages a back surface of the wall mountable connector 84 and helps to reduce or eliminate any backlash (e.g. play or movement) in the z direction. Accordingly, the wall mountable connector 84 may be easily and firmly secured in position on the adaptor plate 86, without subsequent movement. In some cases, the wall mountable connector 84 may instead be secured to the adapter plate 86 via screws or other attachment mechanisms that, for example, extend through the mounting apertures 104, 108 and 112 and engage threaded apertures (not shown) within the adapter plate 86.

Figure 10:
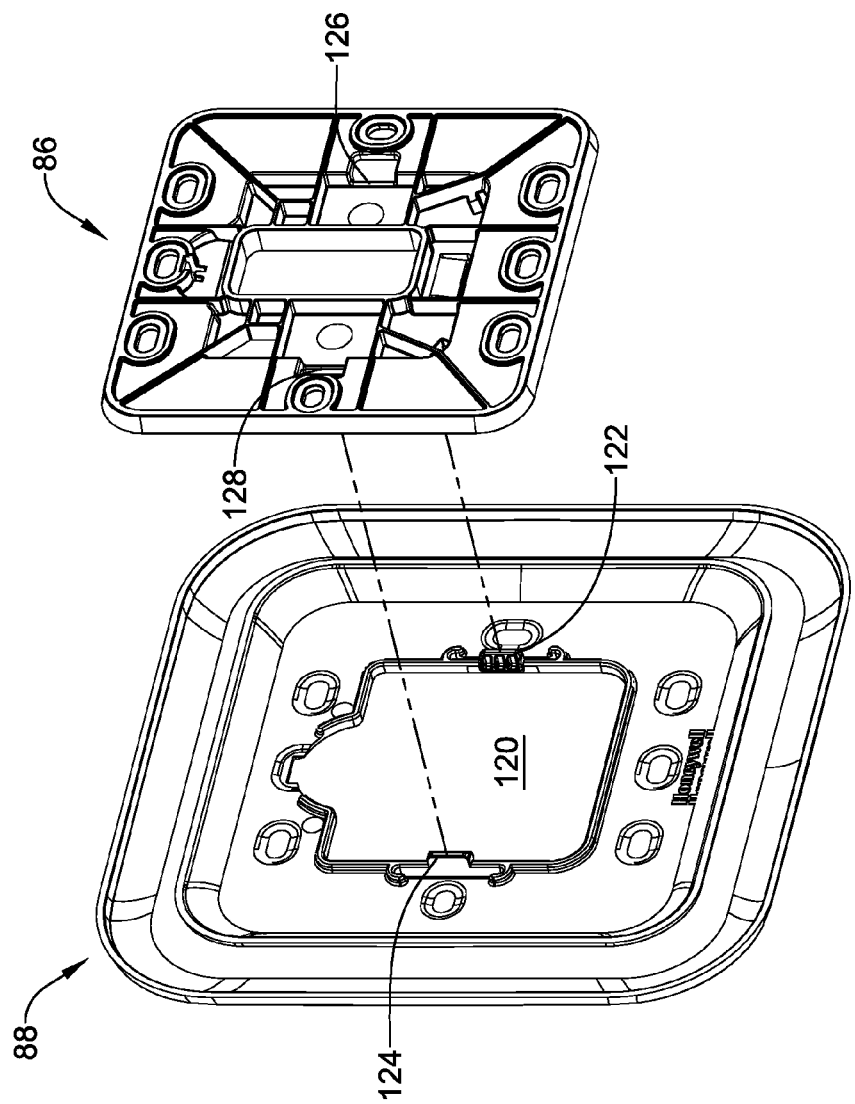
FIG. 10 is an exploded rear perspective view of an adapter plate and a wall covering plate forming a part of the illustrative thermostat assembly of FIG. 3.
Figure 11:
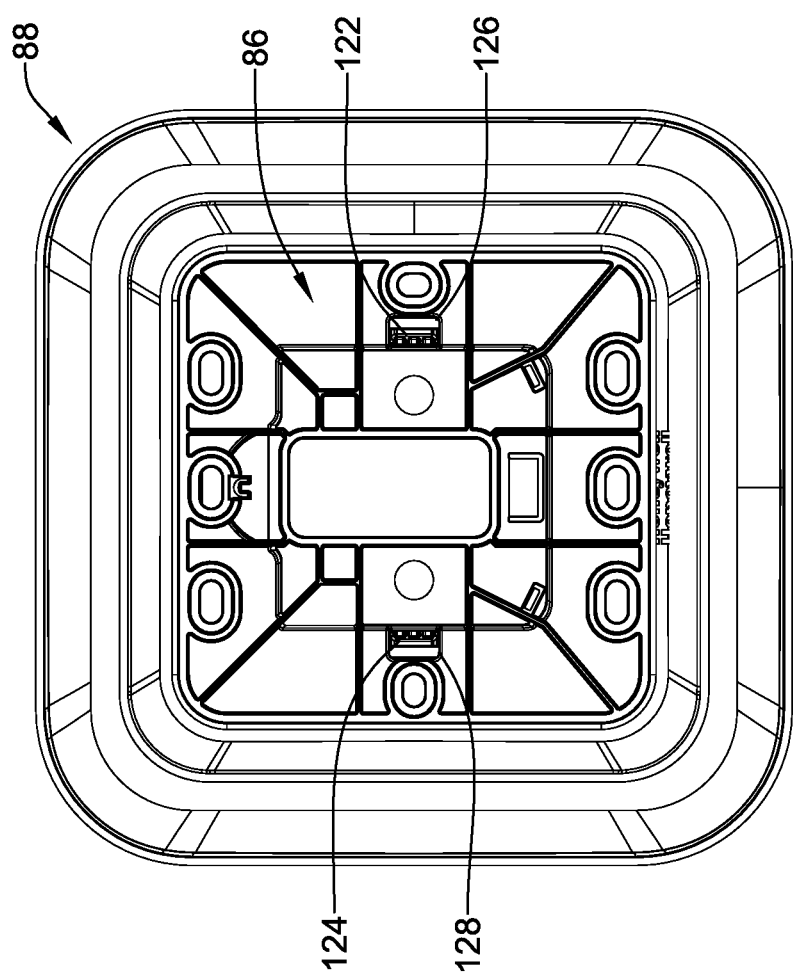
FIG. 11 is a rear plan view of the adapter plate and wall covering plate of FIG. 10, showing the wall covering plate connected to the adapter plate.

FIGS. 10 and 11 provide details of the interaction between the wall covering plate 88 and the adapter plate 86. FIG. 10 is a rear exploded view showing the wall covering plate 88 disposed in front of the adapter plate 86, while FIG. 11 is a rear plan view showing the wall covering plate 88 secured to the adapter plate 86. While the wall mountable connector 84 is not shown in FIGS. 10 and 11, it will be appreciated that the wall covering plate 88 may include a wall mountable connector aperture 120 that is sized and shaped to accommodate the wall mountable connector 84. Accordingly, the wall covering plate 88 may be secured to the adapter plate 86 with the wall mountable connector 84 already secured to the adapter plate 86, as seen for example in FIG. 8. This also means that the wall covering plate 88 may be removed from the adapter plate 86, with the wall mountable connector 84 still secured to the adapter plate 86. For example, the wall covering plate 88 may be temporarily removed for painting or wall papering, or other decorative techniques, then subsequently re-secured to the adapter plate 86. Accordingly, the wall covering plate 88 may be removed, installed, or reinstalled while the wall mountable connector 84 is secured to the adapter plate 86 and moreover remains electrically coupled to the HVAC system 4 (FIGS. 1 and 2) via field wires secured to wiring terminals of the wall mountable connector 84.

In the example shown, the wall covering plate 88 may include a first attachment clip 122 disposed on a first side of the wall mountable connector aperture 120 and a second attachment clip 124 disposed on a second, opposing side, of the wall mountable connector aperture 120. The adapter plate 86 may include a first aperture 126 and a second aperture 128, with the first aperture 126 configured to accommodate the first attachment clip 122 and the second aperture 128 configured to accommodate the second attachment clip 124. In some cases, the first aperture 126 and the second aperture 128 are disposed along or just outside an edge of the raised portion 100, meaning that the wall mountable connector 84 does not interfere with securement of the wall covering plate 88 to the adapter plate 86. With brief reference to FIG. 8, it can be seen that the second aperture 128 is visible, and thus accessible, with the wall mountable connector 84 secured in position on the adapter plate 86.

In some cases, if the adapter plate 86 is not used, the wall mountable connector aperture 120 may be dimensioned to provide a frictional fit with the sides of the wall mountable connector 84. Alternatively, or in addition, the wall covering plate 88 may be held against a vertical surface such as a wall by virtue of being trapped between the wall and the back 92 of the thermostat 82.

As shown for example in FIG. 3, the thermostat 82 may have a substantially square front profile. While the sides of the thermostat 82 may be angled or curved, the front face of the thermostat 82 may be square or rectangular. While the front face of the thermostat 82 is illustrated as being a touch screen, in some cases it will be appreciated that the front face of the thermostat 82 may include, for example, one or more buttons separate from the screen. A back of the thermostat 82, as seen for example in FIG. 6, may be square or rectangular. While a square or rectangular shaped profile is used as one example, it is completed that the thermostat may have any suitable shape or profile as desired (e.g. see FIGS. 12-14B).

It will be appreciated that thermostats having other configurations may be configured to work with the wall mountable connector 84 and optionally with the adapter plate 86 and/or the wall covering plate 88. In some cases, a variety of different thermostats may be used with the wall mountable connector 84. As a result, a first thermostat may be removed from the wall mountable connector 84 and may be disposed of. A second thermostat, which may have the same shape as the first thermostat, or which may have a different shape, may then be secured to the same wall mountable connector 84. In some cases, for example, the wall mountable connector 84 may be considered as being a universal wall mountable connector, enabling installation of a variety of different thermostats without having to disconnect the field wires from the first thermostat and then connect the field wires to the second thermostat. Rather, one may simply pull the first thermostat off the wall mountable connector 84 and subsequently push the second thermostat onto the wall mountable connector 84 in order to install the second thermostat without requiring any tools or wiring knowledge. Further, a thermostat may be easily and temporarily removed for painting, for example, and subsequently snapped back into place on the wall mountable connector 84 afterwards.

Figure 12:
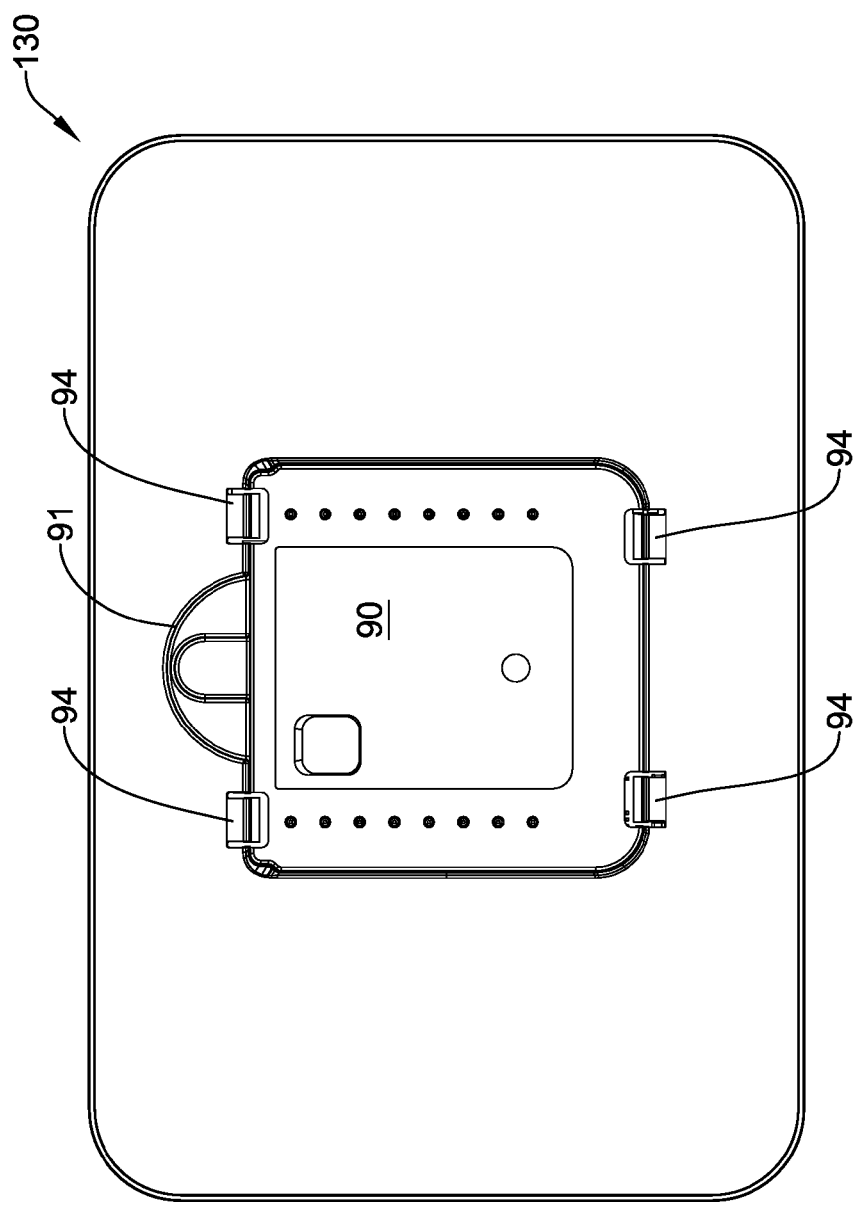
FIG. 12 is a rear view of a rectangular thermostat configured to be used in combination with the wall mountable connector of FIG. 4.
Figure 13:
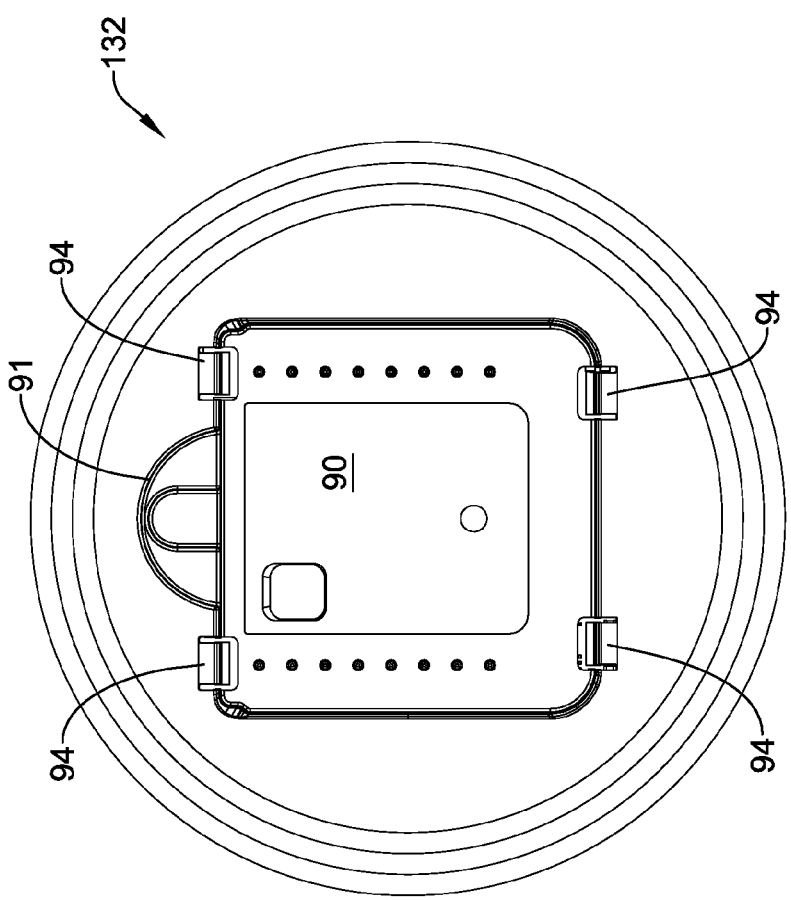
FIG. 13 is a rear view of a circular thermostat configured to be used in combination with the wall mountable connector of FIG. 4.

While thermostats may take any desired shape, size or configuration, FIGS. 12 and 13 provide illustrative but non-limiting examples of thermostats that may be configured to work with the wall mountable connector 84. FIG. 12 is a back view of a thermostat 130 having a rectangular profile. The thermostat 130 includes the same recess 90, including the recessed portion 91 that was shown on the back of the thermostat 82 (FIG. 5). Accordingly, the thermostat 130 may be used in combination with the wall mountable connector 84, and optionally with the adapter plate 86 and/or the wall covering plate 88. It will be appreciated that in some cases, the wall covering plate 88, although illustrated as having substantially square profile, may be modified to have a rectangular profile to better fit behind the thermostat 130.

FIG. 13 is a back view of a thermostat 132 having a circular profile. The thermostat 132 includes the same recess 90, including the recessed portion 91 that was shown on the back of the thermostat 82 (FIG. 5). Accordingly, the thermostat 132 may be used in combination with the wall mountable connector 84, and optionally with the adapter plate 86 and/or the wall covering plate 88. It will be appreciated that in some cases, the wall covering plate 88, although illustrated as having substantially square profile, may be modified to have a circular profile to better fit behind the thermostat 132.

Figure 14A:
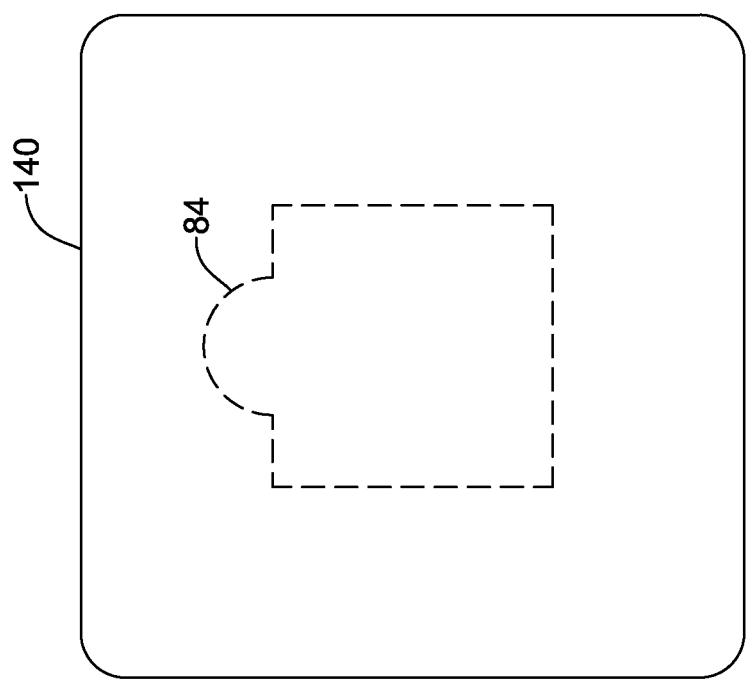
FIG. 14A is a schematic front view of a first thermostat secured to a wall mountable connector.
Figure 14B:
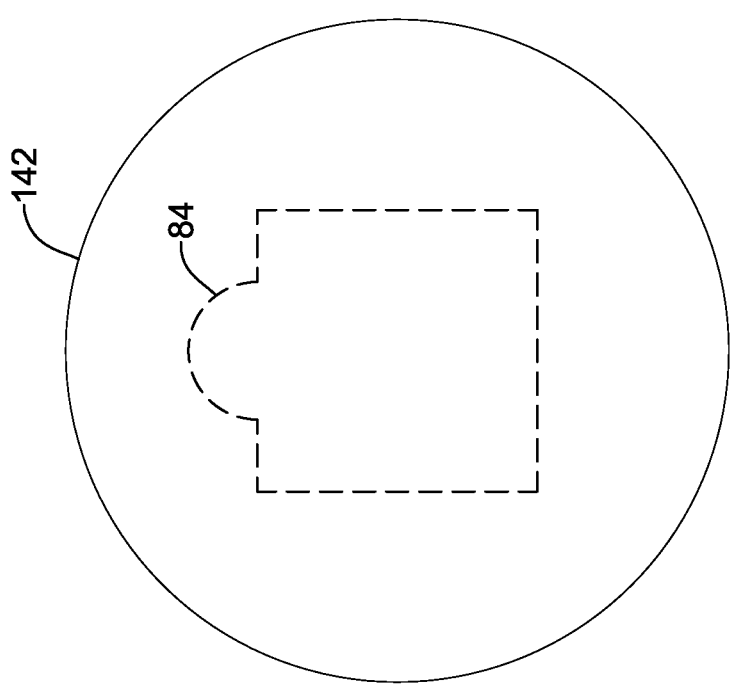
FIG. 14B is a schematic front view of a second thermostat secured to the wall mountable connector.

As noted, in some cases the wall mountable connector 84 may be considered as being a universal wall mountable connector, usable with any number of different thermostat configurations. FIG. 14A illustrates a first thermostat 140 that is secured in position on the wall mountable connector 84. Since this is a front view of the thermostat 140, it will be appreciated that the wall mountable connector 84 is shown in phantom. FIG. 14B illustrates a second thermostat 142 that is secured in position on the wall mountable connector 84. In some cases, the first thermostat 140 may represent an initially or previously installed thermostat, and the second thermostat 142 may represent a replacement thermostat. In some instances, and as will be discussed in greater detail with respect to subsequent Figures, in some cases the wall mountable connector 84 is configured to enable a user to remove the first thermostat 140 from the wall mountable connector 84 and to install a new, different, thermostat such as the second thermostat 142, without having to disconnect and connect any field wires that are operably coupled with the wall mountable connector 84. For example, the second thermostat 142 may have enhanced features that are not present in the first thermostat 140.

In some cases, the first thermostat 140 may have stored information such as stored configuration information that may be useful to the second thermostat 142. For example, the stored information may include thermostat configuration data, such as but not limited to, thermostat scheduling data such as a programmable schedule, information about the HVAC system that is to be controlled (e.g. furnace type, number of stages, etc.), thermostat settings (e.g. WiFi password, low temperature limit), contractor information (e.g. contractor name, address, contractor information, and logo), and/or other information. In some cases, the stored information may include login information for a local wireless source and/or a remote server, such as that referenced in FIG. 2.

Figure 15:
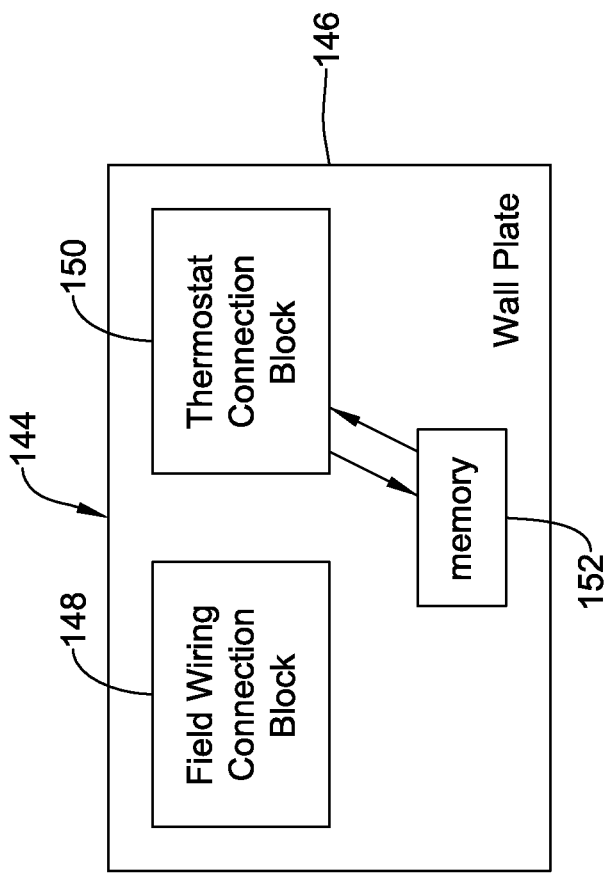
FIG. 15 is a schematic block diagram of the wall mountable connector of FIG. 4, useful in combination with the first thermostat of FIG. 14A and/or the second thermostat of FIG. 14B.

FIG. 15 is a schematic block diagram of a wall mountable connector 144 that may be considered as representing the wall mountable connector 84 (FIG. 2) and that may be used in combination with the first thermostat 140 and/or the second thermostat 142. The illustrative wall mountable connector 144 includes a housing 146 that may be configured to be mounted to a wall and is configured to provide a standardized mechanical connection between the wall mountable connector 144 and each of the first thermostat 140, the second thermostat 142 (and in some cases other thermostats that are in a line of compatible thermostats). The wall mountable connector 144 may include a field wiring connection block 148 that is configured to provide an electrical connection between the wall mountable connector 144 and a plurality of field wires that are coupled with the HVAC system 4 (FIG. 1). In some cases, the field wiring connection block 148 may be replaced by a wireless connection block that is configured to provide wireless communication between the wall mountable connector 144 and an HVAC system 4 that is to be controlled via the wall mountable connector 144. A thermostat connection block 150 may provide a standardized electrical connection between the wall mountable connector 144 and the thermostats 140, 142. The wall mountable connector 144 may be electrically coupled to the thermostat 140, 142 via the thermostat connection block 150, and the wall mountable connector 144 may be communicatively coupled to the HVAC system 4 via the field wiring connection block 148 and/or the wireless connection block (not shown). When so provided, there may be a standardized mechanical and electrical connection to the wall mountable connector 144 such that the first thermostat 140 may be removed and replaced with the second thermostat 142.

In some cases, the wall mountable connector 144 may further include a memory 152 that is configured to store data and/or other information that was communicated to the memory 152 by a first thermostat from a line of compatible thermostats (e.g. from first thermostat 140). In some cases, the data and/or other information may be communicated from the first thermostat automatically or on-command. In some cases, the memory 152 may be configured to communicate the stored data and/or information to a subsequently installed second thermostat from the line of compatible thermostat (e.g. to the second thermostat 142). In some cases, the memory 152 may be configured to communicate with each thermostat in the line of compatible thermostats. In some instances, for example, the memory 152 may be configured to, automatically or on-command, communicate the stored data and/or information to the subsequently installed second thermostat to at least partially configure the subsequently installed second thermostat using settings from the first thermostat. This information may include thermostat configuration data, such as but not limited to, thermostat scheduling data such as a programmable schedule, information about the HVAC system that is to be controlled (e.g. furnace type, number of stages, etc.), thermostat settings (e.g. WiFi password, low temperature limit), contractor information (e.g. contractor name, address, contractor information, and logo), and/or other information. In some cases, the stored information may include login information for a local wireless source and/or a remote server, such as that referenced in FIG. 2.

Figure 16:
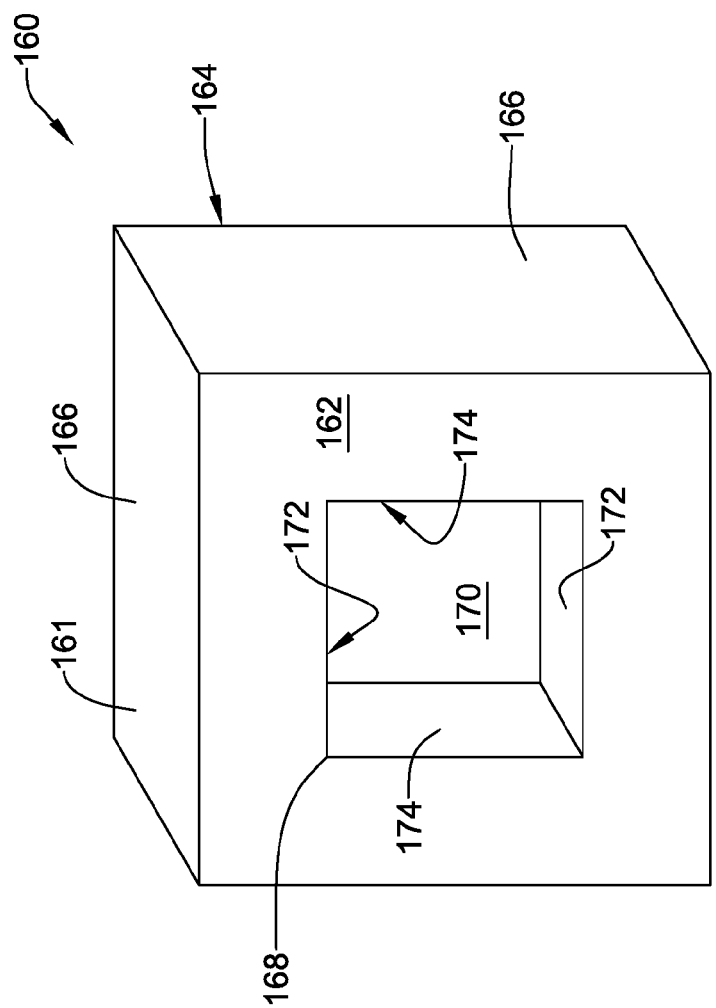
FIG. 16 is a schematic illustration of a thermostat useful for use with the wall mountable connector of FIG. 15.

FIG. 16 is a schematic illustration of an illustrative thermostat 160 which may be used in combination with the wall mountable connector 144 and which may schematically represent the first thermostat 140 and/or the second thermostat 142 discussed above. The thermostat 160 is illustrated as having a housing 161 with a rear face 162 and a front face (not visible) 164 and side walls 166 extending between the rear face 162 and the front face 164. A rear-facing recess 168 is disposed within the rear face 162 of the housing 161 and extends toward the front face 164. The rear-facing recess 168 includes a bottom surface 170, upper and lower side walls 172 and left and right side walls 174 (with respect to the illustrated orientation). The rear-facing recess 168 may, for example, be configured to receive at least part of the wall mountable connector 144. In some cases, the rear-facing recess 168 of the thermostat is configured to receive at least 30 percent of the wall mountable connector 144 before the thermostat connection block 150 (see FIG. 15) electrically connects the thermostat 160 to the wall mountable connector 144. This may help first mechanically align the thermostat 160 to the wall mountable connector 144 before the thermostat connection block 150 electrically connects the thermostat 160 to the wall mountable connector 144. In some cases, the rear-facing recess 168 is dimensioned such that the rear-facing recess 168 is able to receive at least 80 percent of the wall mountable connector 144 before the standardized mechanical connection between the wall mountable connector 144 and the thermostat 160 (e.g. latches 94) becomes fully engaged.

Figure 17:
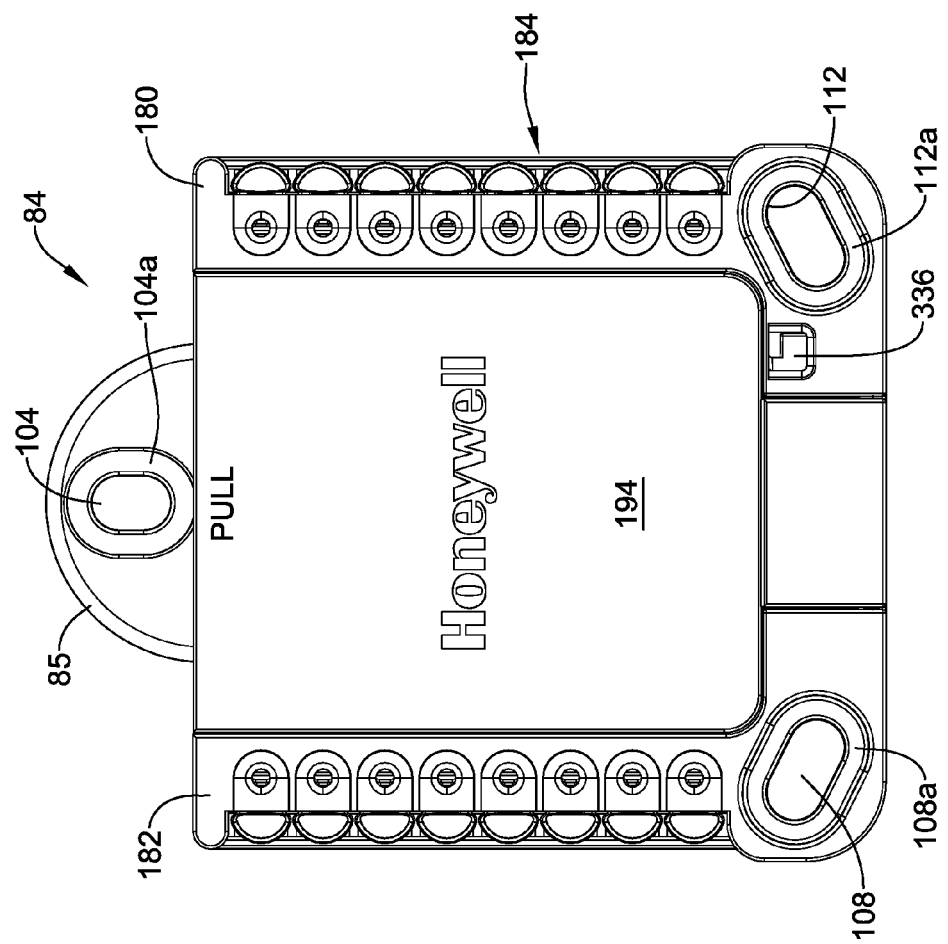
FIG. 17 is a front view of the wall mountable connector of FIG. 4.
Figure 25:
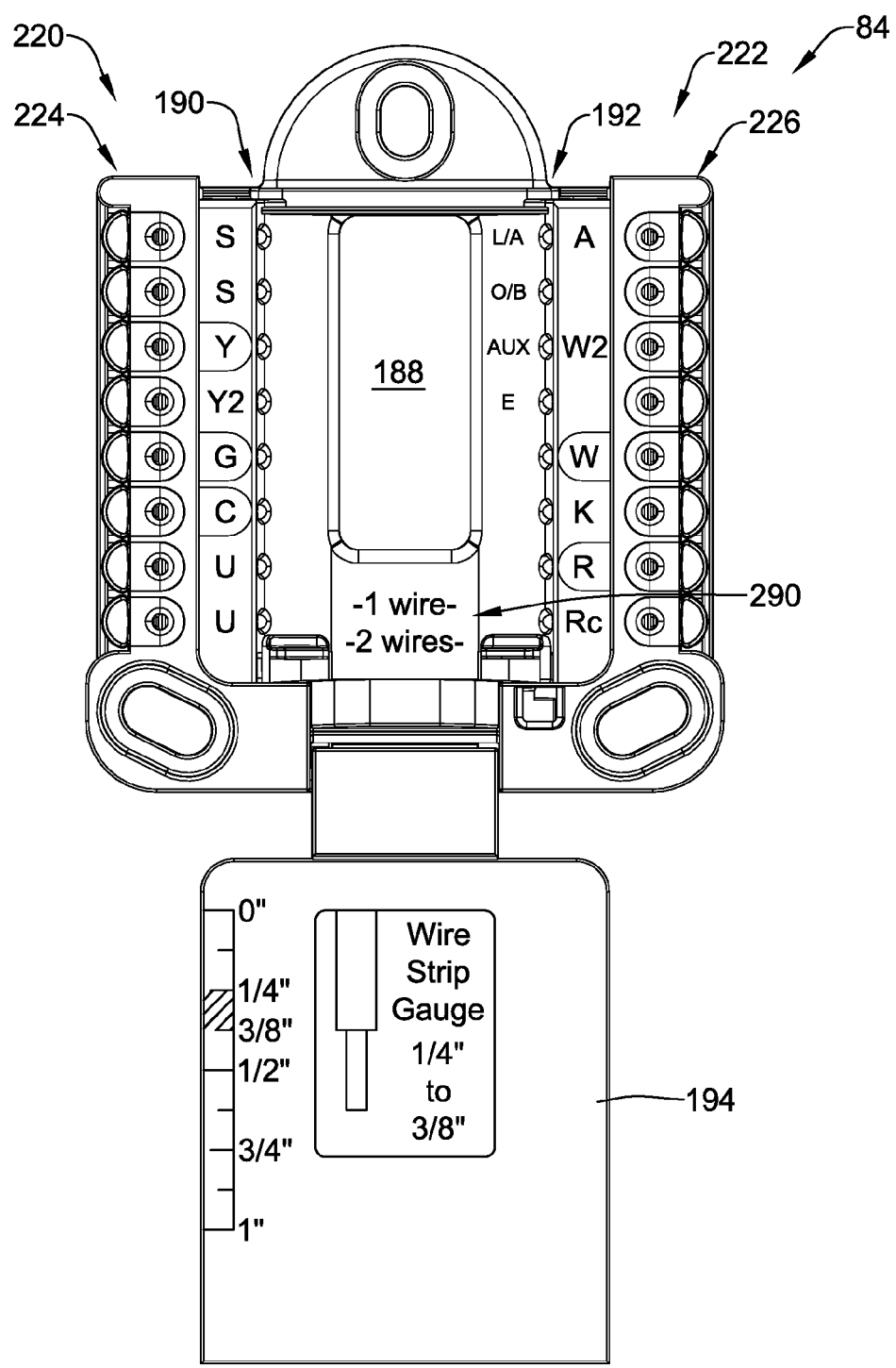
FIG. 25 is a front view of the wall mountable connector with the door in the open position, indicating relative terminal positions in a sixteen terminal wall mountable connector.

FIG. 17 is a front view of the illustrative wall mountable connector 84. The illustrative wall mountable connector 84 includes a housing 180 having a front side 182 and a back side 184 that is configured to be mountable to a wall. In some cases, the back side 184 may be configured to be mounted directly to a wall. In some cases, the back side 184 may be configured to be mounted to a wall via connection to an adapter plate such as the adapter plate 86. The back side 184 of the illustrative wall mountable connector may be seen, for example, in FIG. 5. The illustrative wall mountable connector 84 includes a door 194 that is movable between a closed position, as shown in FIG. 17, and an open position, as shown in FIG. 25. I As noted, the wall mountable connector 84 may be secured relative to a vertical surface such as a wall by using the upper mounting aperture 104, the first lower mounting aperture 108 and/or the second lower mounting aperture 112, sometimes using fasteners such as screws, nails or the like. In some cases, having a total of three mounting apertures 104, 108, 112 may make it easier, particularly when mounting directly to a wall, to hit a wall stud with at least one of the fasteners. In some cases, it will be appreciated that having three mounting apertures 104, 108, 112, particularly arranged at the vertices of a triangle, may be sufficient to securely fasten the wall mountable connector 84 to a wall or to the adapter plate 86 without requiring a fourth mounting aperture and corresponding fastener. In some cases, the upper mounting aperture 104, the first lower mounting aperture 108 and the second lower mounting aperture 112 may be considered as being located at the vertices of an isosceles triangle, but this is not required. In some cases, the upper mounting aperture 104, the first lower mounting aperture 108 and the second lower mounting aperture 112 may be considered as being located at the vertices of an equilateral triangle, but this is not required.

In some instances, it will be appreciated that the first lower mounting aperture 108 may be disposed within a lower portion of the wall mountable connector 84 and may be offset to the left of the upper mounting aperture 104. Similarly, the second lower mounting aperture 112 may be disposed within a lower portion of the wall mountable connector 84 and may be offset to the right of the upper mounting aperture 104. In some instances, the upper mounting aperture 104 may be or otherwise may include a vertically aligned elongate slot, meaning that the upper mounting aperture 104 may have a height that is greater than a width of the upper mounting aperture 104. In some cases, the first lower mounting aperture 108 may be or otherwise may include an elongate slot that, as illustrated, is orientated diagonally, extending from an upper position at the left side of the elongate slot to a lower position at the right side of the elongate slot. In some cases, the second lower mounting aperture 112 may be or may otherwise include an elongate slot that is oriented diagonally, extending from a lower position at the left side of the slot to an upper position at the right side of the elongate slot. The elongated shape of the slots may provide some leeway in the orientation (e.g. vertical and/or rotational orientation) of the wall mountable connector 84 relative to the fasteners, which may be particularly beneficial when the precise positioning of the fasteners may vary from installation to installation.

In some cases, the upper mounting aperture 104 may include a reduced height shoulder portion 104a that may be configured to accommodate a fastener head or, as shown in FIG. 8, a corresponding mounting latch. In some instances, the first lower mounting aperture 108 may include a reduced height shoulder portion 108a that may be configured to accommodate a fastener head or, as shown in FIG. 8, a corresponding mounting latch. In some instances, the second lower mounting aperture 112 may include a reduced height shoulder portion 112a that may be configured to accommodate a fastener head or, as shown in FIG. 8, a corresponding mounting latch.

Figure 18:
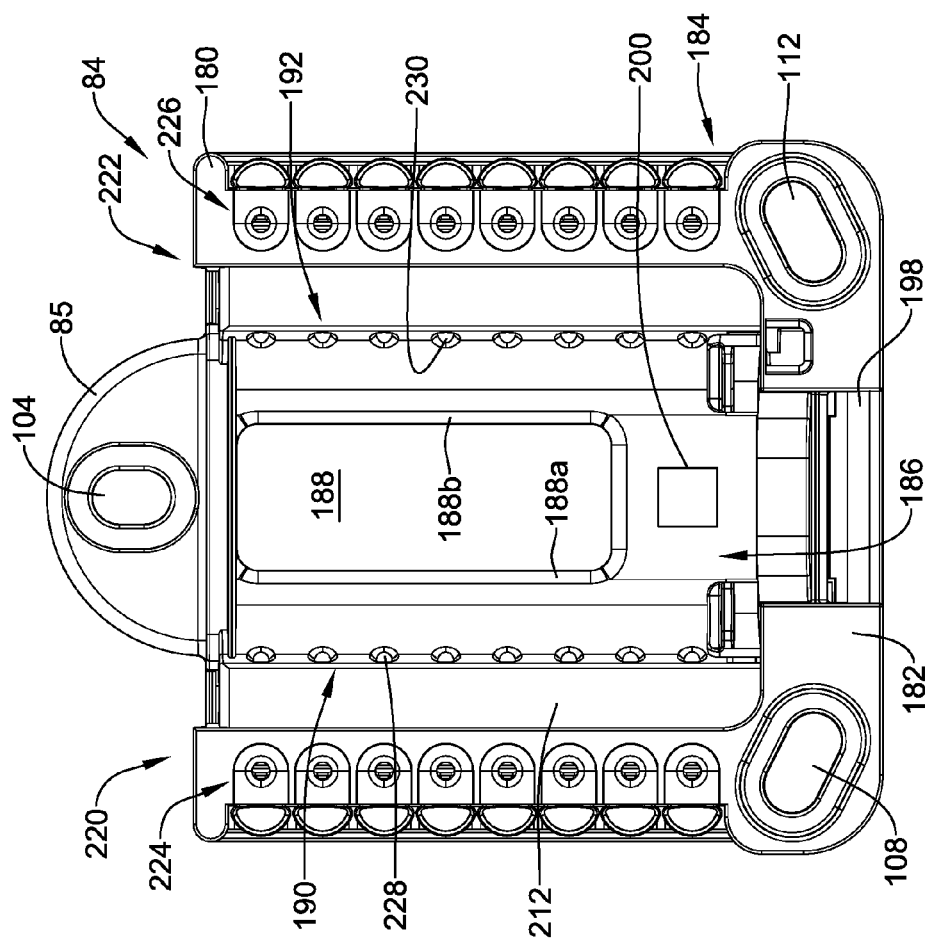
FIG. 18 is a front view of the wall mountable connector of FIG. 17, shown without the door.

FIG. 18 shows the wall mountable connector 84 with the door 194 removed in order to reference additional features of the wall mountable connector 84. In some cases, the housing 180 includes a recess 212 that at least partially accommodates or receives the door 194 when the door 194 is in the closed position. In some instances, and as seen in FIG. 18, the housing 180 may be considered as defining a field wire receiving cavity 186. The housing 180 also defines a field wire aperture 188 that extends through the back side 184 of the housing 180 and into the field wire receiving cavity 186. In some cases, the field wire receiving cavity 186 may be considered as being a space in front of the field wire aperture 188. In some cases, the sides of the field wire receiving cavity 186 may be beveled to provide easier access to wiring terminals of the wall mountable connector 84 and to facilitate attachment of field wires.

Figure 19:
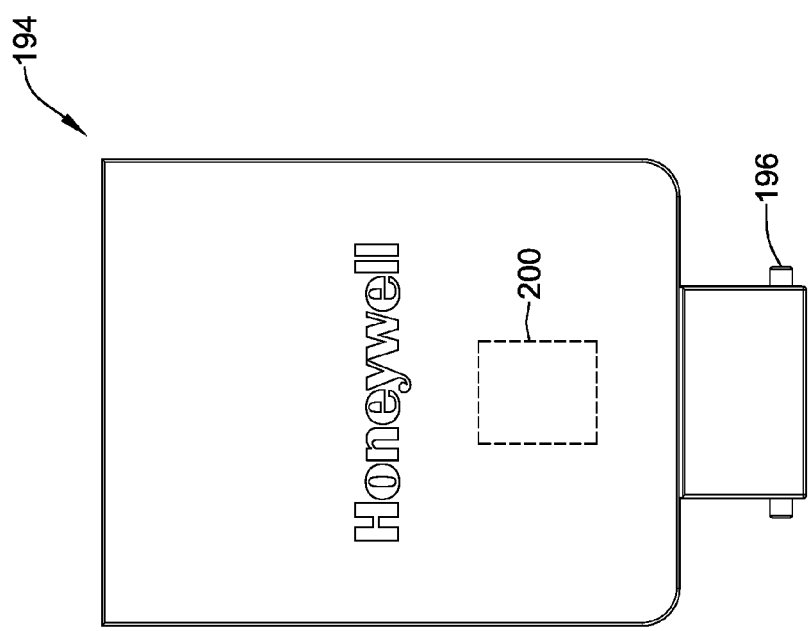
FIG. 19 is a front view of the door removed in FIG. 18, illustrating one possible location for an optional memory.
Figure 20:
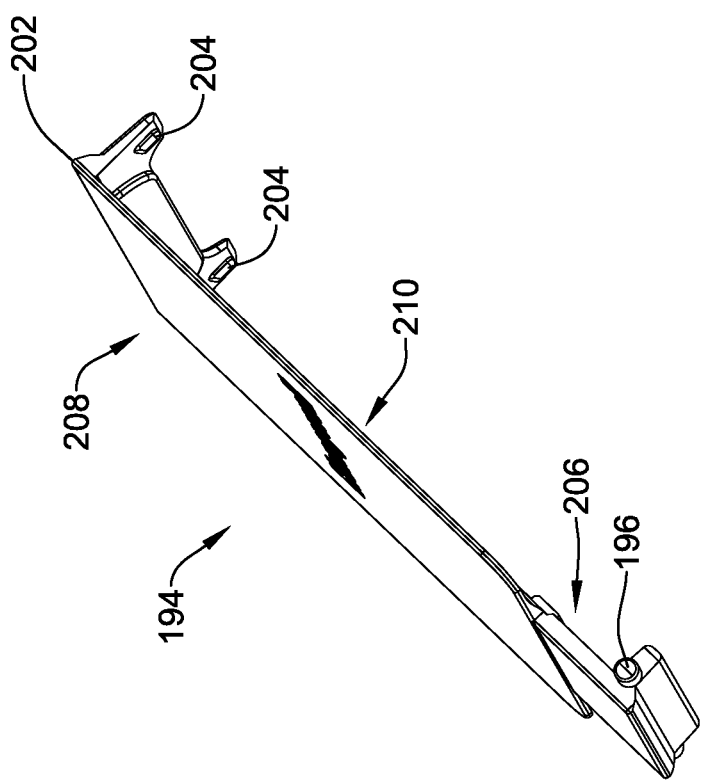
FIG. 20 is a perspective view of the door removed in FIG. 18.

In some cases, the first lower mounting aperture 108 may be offset to the left of a left side 188a of the field wire aperture 188 by a distance that is no more than 1.5 inches. In some cases, the second lower mounting aperture 112 may be offset to the right of a right side 188b of the field wire aperture 188 by a distance that is no more than 1.5 inches. The field wire aperture 188 may be configured to accommodate one or more field wires exiting the wall and passing through the field wire aperture 188. In some cases, the wall mountable connector 84 may include a first wiring connection block 190 that is positioned along the left side of the field wire receiving cavity 186 and that is configured to electrically connect to one or more field wires. A second wiring connection block 192 may be positioned along the right side of the field wire receiving cavity 186 and may be configured to electrically connect to one or more field wires. In some cases, a front side of the field wire receiving cavity 186 may be open to allow a user to gain access and to electrically connect one or more field wires that are in the field wire receiving cavity 186 to the first wiring connection block 190 and to connect one or more other field wires to the second wiring connection block 192. It will be appreciated that in FIG. 18, a door 194 (seen in FIG. 19) has been removed for clarity. In some cases, as can be seen in FIG. 19, the door 194 may include a hinge portion 196 that interacts with a corresponding hinge portion 198 on the wall mountable connector 84 (FIG. 18) to enable the door to be opened or closed as desired without entirely removing the door 194 from the wall mountable connector 84.

In some cases, the wall mountable connector 84 may, as referenced with respect to FIG. 15 and wall mountable connector 144, include a memory 200 that may be configured to store data, settings and/or other information that is communicated by an initially installed thermostat, such as but not limited to, the first thermostat 140 (FIG. 14A), and to communicate the stored data, settings and/or other information to a subsequently installed second thermostat such as, but not limited to, the second thermostat 142 (FIG. 14B). In some cases, the memory 200 may be disposed somewhere within the field wire receiving cavity 186. In some cases, the memory 200 may be secured to a back side of the door 194, as shown in phantom in FIG. 19. In some cases, as can be seen for example by comparing FIG. 17 with FIG. 18, when the door 194 is in the closed position (as seen in FIG. 17), the door 194 covers the front side of the field wire receiving cavity 186, the first wiring connection block 190 and the second wiring connection block 192. When the door 194 is in the open position (effectively illustrated in FIG. 18), the user gains access to the field wire receiving cavity 186, the first wiring connection block 190 and the second wiring connection block 192. In some cases, the door 194 helps to ensure that all the field wires are properly tucked in, as if a field wire extends too far outwardly, the door 194 will hit it, thus providing feedback to the installer. In some instances, the door 194 helps to block airflow into the back of the thermostat 82. Absent the door 194, air can flow out of the wall, for example, and into the thermostat 82. Air flow can negatively impact the accuracy of any thermometer within the thermostat 82, for example.

In some cases, as illustrated, the door 194 may include a hinge 196, sometimes located at or near a lower end 206 of the door 194. A securement 204 may be disposed at or near an upper end 208 of the door 194, and may be configured to releasably secure the door 194 in the closed position. As illustrated, the door 194 may include a pair of securements 204. In some cases, the door 194 may include only a single securement 204 or may include three or more individual securements 204. In some cases, the door 194 may include a graspable portion 202 (e.g. lip or tab) that helps the user to grasp and open the door 194 and to move the door 194 from the closed position to the open position. As illustrated, the graspable portion 202 may include an upward extending lip that spans across the upper end 208 of the door 194. In some cases, the graspable portion 202 may be disposed near the securements 204.

In the example shown, the door 194 includes an inner surface 210. In some cases, the inner surface 210 may include printed information. Illustrative but non-limiting examples of such printed information include text instructing the user to check a website for thermostat compatibility information, or text providing the user with instructions such as how to strip the insulation off of the field wires, and a scaled diagram showing how much insulation to strip off. The scale of the diagram can be 1:1, which may allow the user to use the diagram to measure out how much insulation to strip off. This can be seen, for example, in FIGS. 25 and 26.

Returning to FIG. 18, the wall mountable connector 84 may include a first connection block 220 that is disposed on a first side of the field wire receiving cavity 186 and a second connection block 222 that is disposed on a second side of the field wire receiving cavity 186. It will be appreciated that the first connection block 220 may include the first wiring connection block 190 and the second connection block may include the second wiring connection block 192. The first connection block 220 also includes a first column 224 of pin terminals and the second connection block 222 also includes a second column 226 of pin terminals. It will be appreciated that the first column 224 of pin terminals may be configured to accommodate a first column of pins extending backward from the thermostat, and the second column 226 of pin terminals may be configured to accommodate a second column of pins extending backward from the thermostat. The pin terminals extending backward from the thermostat may be seen, for example, in FIG. 5.

In some cases, the first wiring connection block 190 may be considered as being a first column of wiring terminals 228 and the second wiring connection block 192 may be considered as being a second column of wiring terminals 230. As will be illustrated, each of the wiring terminals 228 may be electrically coupled with a corresponding pin terminal of the first column 224 of pin terminals. Similarly, each of the wiring terminals 230 may be electrically coupled with a corresponding pin terminal of the second column 226 of pin terminals. It will be appreciated that when the door 194 is closed, the first column 224 of pin terminals and the second column 226 of pin terminals remain accessible while the first column of wiring terminals 228 and the second column of wiring terminals 230 may be inaccessible to the user. In some cases, a first set of labels labeling the first column of wiring terminals 228 and/or a second set of labels labeling the second column of wiring terminals 230, discussed subsequently, may be disposed within the recess 212, and thus may be visible when the door 194 is in the open position but hidden when the door 194 is in the closed position. This labeling may be seen, for example, in FIGS. 25 and 26.

Figure 21:
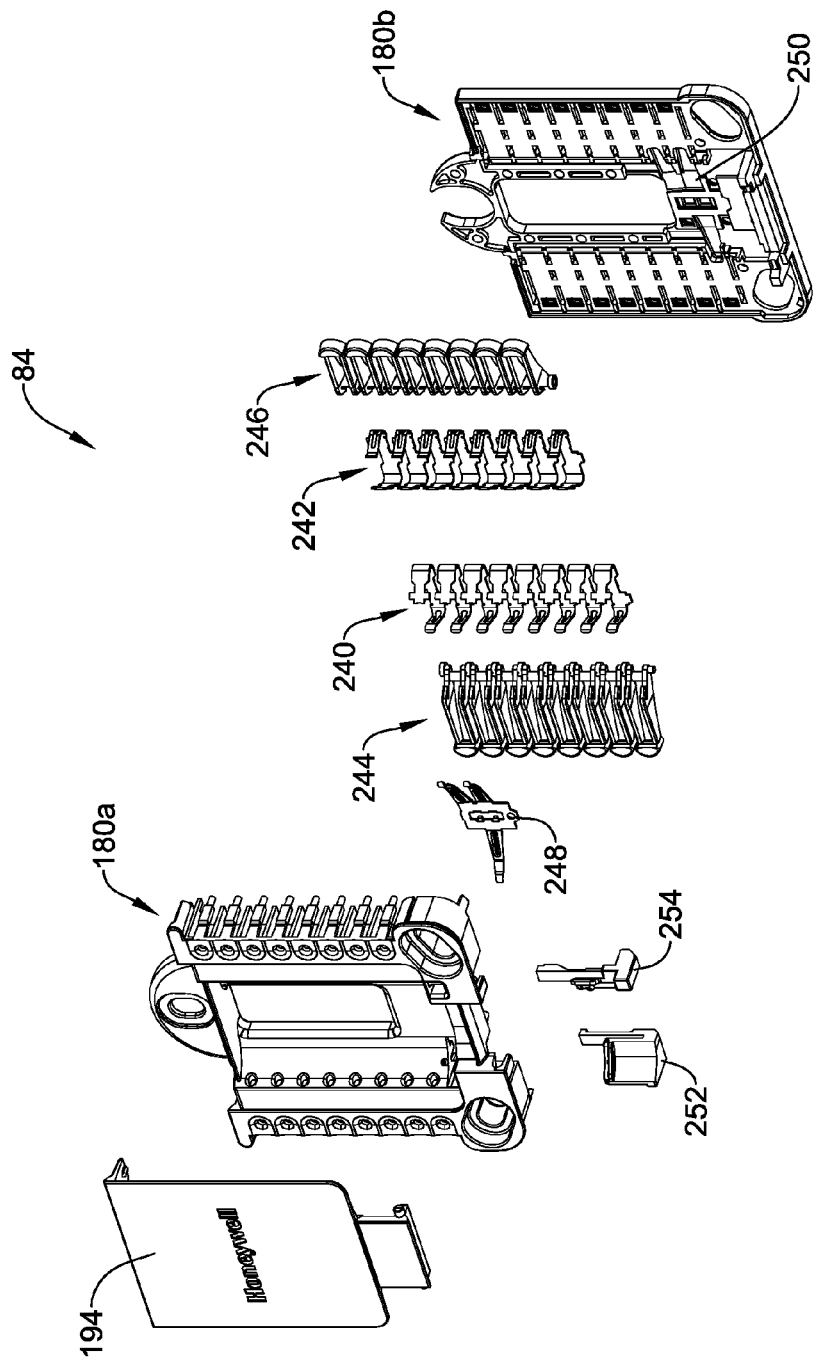
FIG. 21 is an exploded view of the wall mountable connector of FIG. 4.

FIG. 21 is an exploded view of the wall mountable connector 84, providing a better view of some of the components that together form the wall mountable connector 84. In some cases, as illustrated, the housing 180 may include a front housing portion 180*a* and a back housing portion 180*b*. In some instances, the housing 180 may include three or more molded sections or portions. In some cases, the housing 180 may be molded as a single molded structure. It will be appreciated that, in the example shown, the front housing portion 180*a* and the back housing portion 180*b* cooperate to provide space for and to secure a plurality of conductive contact members that are arranged into a first column of conductive contact members 240 and a second column of conductive contact members 242. It will be appreciated that the first column of conductive contact members 240 may be disposed on the left side of the field wire receiving cavity 186 and may electrically couple each of the first column of wiring terminals 228 (formed by the first wiring connection block 190) with a corresponding one of the first column of pin terminals 224. Similarly, the second column of conductive contact members 242 may be disposed on the right side of the field wire receiving cavity 186 and may electrically couple each of the second column of wiring terminals 230 (formed by the second wiring connection block 192) with a corresponding one of the second column of pin terminals 226.

A first column of levers 244 are disposed on the left side of the field wire receiving cavity 186. Each of the first column of levers 244 may be configured to accommodate one of the first plurality of conductive contact members 240 within the lever 244. A second column of levers 246 are disposed on the right side of the field wire receiving cavity 186. Each of the second column of levers 246 may be configured to accommodate one of the second plurality of conductive contact members 242. In some cases, inserting a field wire into one of the wiring terminals 228 or 230 causes the corresponding lever 244 or 246 to deflect partially, providing an indication that a field wire has been inserted into the corresponding wiring terminal 228 or 230. In some cases, the levers are visible to the user even when the door 194 is closed (e.g. see FIGS. 4 and 7), and therefore a user may be able to determine which terminals have a corresponding field wire connected by viewing whether the corresponding lever is partially deflected or not. In some cases, each of the individual levers 244 and 246 may be easily individually addressable by an installer, for example, meaning that they can simply use their finger to easily depress a desired lever if they wish to remove an already inserted field wire, or perhaps to make insertion of a field wire easier. In some cases, the ends of the levers may be rounded to help the user engage only one of the levers (a desired lever) without also engaging an adjacent lever. While a rounded end shape is shown, it is contemplated that the shape of the end of the levers may be any suitable shape that aids the user in selecting only one of the levers. This may include any shape that produces a different length at both the lower edge and the upper edge of the lever relative to the two adjacent levers. This can be particularly useful with the pitch of the levers becomes small relative to the size of a finger. As can be seen in FIG. 21, in some cases the individual levers 244 (or the individual levers 246) nest together, which helps to conserve space within the wall mountable connector 84 and reduce the pitch of the field wiring terminals and the corresponding levers.

In some cases, a lead frame 248 may fit into a corresponding recess 250 formed within the back housing portion 180b. The wall mountable connector 84 may include a U terminal slider 252 and an R terminal slider 254, both of which will be discussed in greater detail hereinafter.

Figure 22:
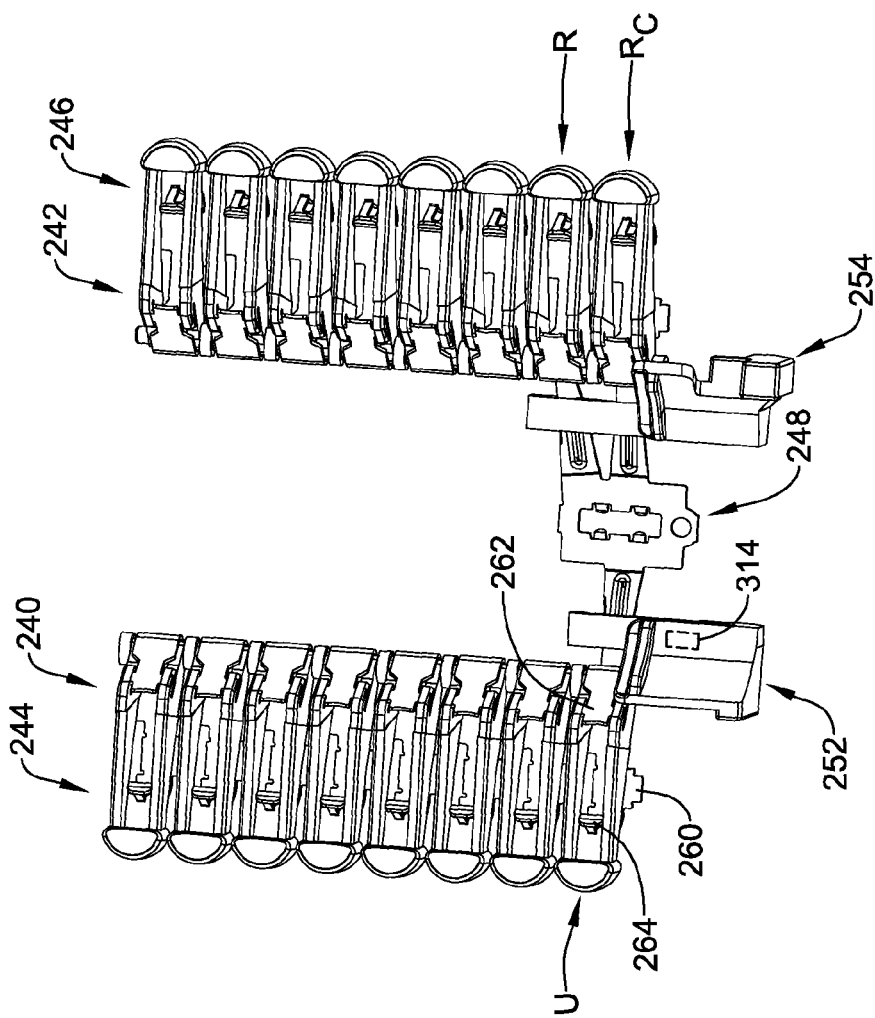
FIG. 22 is a perspective view of some internal components of the wall mountable connector.

Interactions between some of these components may be seen in FIG. 22, which is a view of the wall mountable connector 84 with the front housing portion 180a, the back housing portion 180b and the door 194 removed. As can be seen, each of the first plurality of conductive contact members 240 fit into a corresponding one of the first column of levers 244. Similarly, each of the second plurality of conductive contact members 242 fit into a corresponding one of the second column of levers 246. As will be discussed subsequently, the lead frame 248, the U terminal slider 252 and the R terminal slider 254 may cooperate to selectively electrically connect or disconnect several of the wiring terminals 228 and/or 230. With particular attention to the lowermost of the first plurality of conductive contact members 240, labeled here as conductive contact member 260, it can be seen that the conductive contact member 260 has a first end 262 that is configured to make physical and electrical contact with a field wire that is inserted into the corresponding wiring terminal 228. The conductive contact member 260 also has a second end 264 that is configured to make physical and electrical contact with a pin (extending backward from a thermostat) that is inserted into the corresponding pin terminal 224. Accordingly, the conductive contact member 260 may be configured to provide an electrical connection between a wiring terminal 228 and the corresponding pin terminal 224. In some cases, the conductive contact member 260 may be flex when a field wire that is inserted into the corresponding wiring terminal 228 and/or when a pin is inserted into the corresponding pin terminal 224. This flex may cause the conductive contact member 260 to provide a mechanical bias force against the field wire and/or pin terminal 224, which can help provide a friction connection therebetween. This friction connection can help hold the field wire in place and/or help hold the thermostat pin and thus the thermostat to the wall mountable connector 84. For example, in some cases, as a pulling force is applied to a field wire, a bending moment caused by the conductive contact member 260 further increases a normal force and thus holds the field wire more securely.

Figure 23:
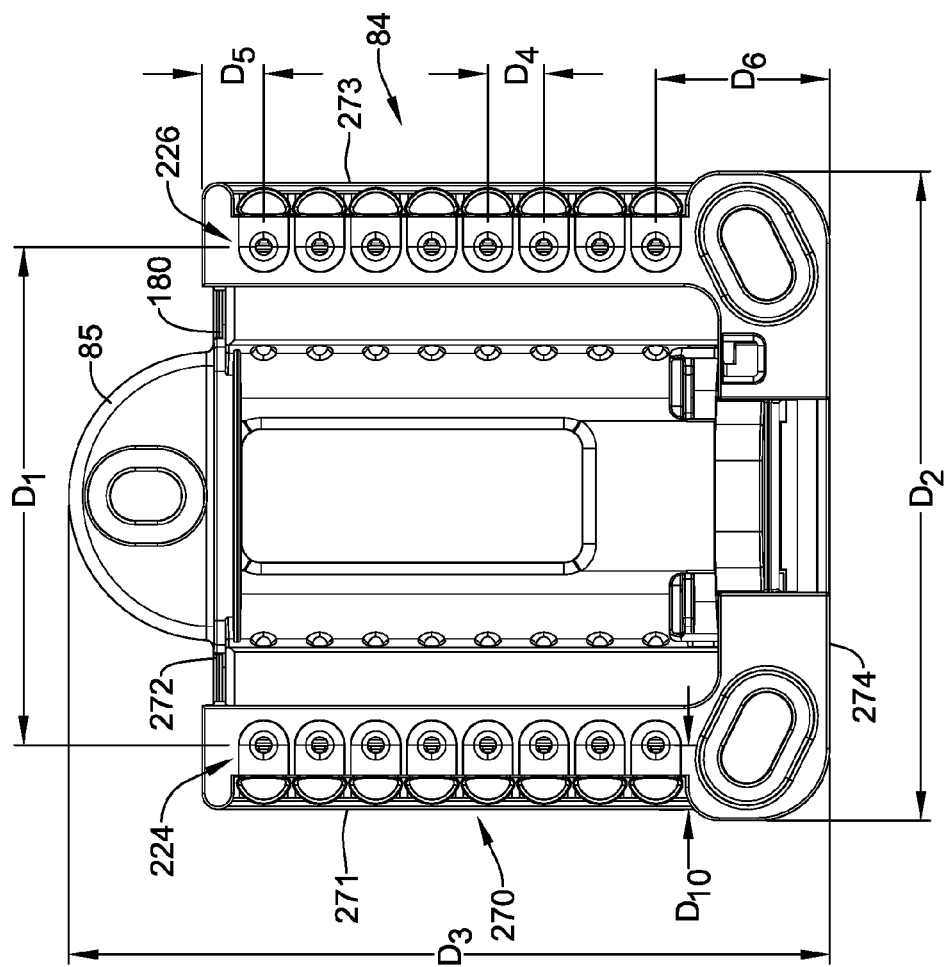
FIG. 23 is a front view of the wall mountable connector, with particular dimensions annotated.

FIG. 23 is a front view of the wall mountable connector 84, annotated to define several dimensions. In some cases, as illustrated, the first column of pin terminals 224 may be at least substantially parallel with the second column of pin terminals 226. In this, substantially parallel may be defined as being within about plus or minus 10 degrees from a geometric parallel. In some cases, the first column of pin terminals 224 is spaced a distance labeled $D_1$ from the second column of pin terminals 226. In some instances, $D_1$ may range from 30 millimeters (mm) to 60 mm. In some instances, $D_1$ may range from 40 mm to 50 mm. In some instances, $D_1$ may be about 44.5 mm, where "about" refers to plus or minus ten percent. The wall mountable connector 84 may have an overall width that is labeled as $D_2$ and an overall height that is labeled as $D_3$. In some instances, $D_2$ may be less than about 80 mm, or less than about 70 mm, or less than about 60 mm. In some cases, $D_3$ may be less than about 80 mm, or less than about 70 mm. In some cases, there may be a spacing labeled $D_4$ between adjacent pins. $D_4$ may be about 15 mm or less, 10 mm or less, 5 mm or less, or another suitable dimension. In some cases, the spacing between adjacent pins labeled $D_4$ may be about 5 mm. It will be appreciated that a thermostat made to be secured to the wall mountable connector 84, such as the thermostat 82, 130, 132, 140, 142, 160 may have inter-pin and inter-pin column spacing that corresponds to that of the wall mountable connector 84.

In some instances, the housing 180 of the wall mountable connector 84 may be considered as including a male portion 270. In some cases, the male portion 270 may be considered as being a portion of the wall mountable connector 84 that extends into the recess 90 formed in the back of the thermostat 82, for example. In some cases, the male portion 270 may be considered as forming all of the housing 180. In some instances, the male portion 270 may be the portion of the housing 180 that extends outwardly farther than the mounting tab 85. In some cases, the first column of pin terminals 224 may be parallel with and vertically aligned with the second column of pin terminals 226. In some cases, the first column of pin terminals 224 and the second column of pin terminals 226 may be vertically asymmetric, meaning that they are not vertically centered on the wall mountable connector 84, but instead are disposed closer to a top 272 of the housing 180 than they are to a bottom 274 of the housing 180. In some cases, a top pin terminal 224, 226 may be spaced from the top 272 a distance that is labeled as $D_5$ while a bottom pin terminal 224, 226 may be spaced from the bottom 274 a distance that is labeled as $D_6$. $D_6$ may be larger than $D_5$. In some cases, $D_5$ may be less than about 8 mm. $D_5$ may be between about 4.5 mm and about 6.5 mm. $D_6$ may be about 18 mm or less. In some cases, $D_6$ may be between about 14.5 mm and about 16.5 mm.

In some cases, it may be useful to describe the position of the pin terminals 224 and 226 relative to an outer edge of the wall mountable connector 84. With reference to FIG. 23, the wall mountable connector 84 may be considered as having a left edge 271 and a right edge 273. In some cases, the pin terminals 224 may be spaced from the left edge 271 a distance that is labeled as $D_9$. It will be appreciated that the pin terminals 226 may be spaced from the right edge 273 a distance equal to $D_9$. In some cases, $D_9$ may be between about 3 mm and about 20 mm. $D_9$ may be between about 4 mm and about 12 mm. $D_9$ may be between about 5 mm and about 8 mm. In some cases, $D_9$ may be about 6 mm. It will be appreciated that in some cases, these dimensions contribute to providing a wall mountable connector 84 that maximizes the size of the field wire receiving cavity 186 while minimizing the overall footprint of the wall mountable connector 84.

Figure 24:
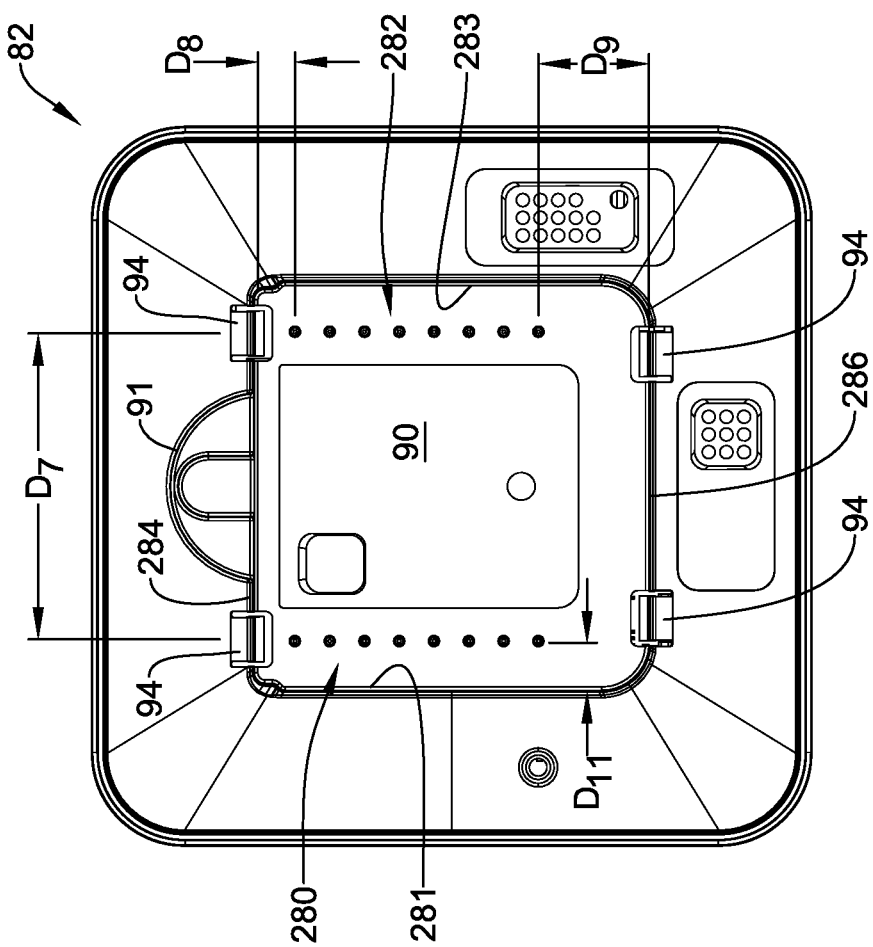
FIG. 24 is a back view of a thermostat usable with the wall mountable connector of FIG. 23, with particular dimensions annotated.

FIG. 24 is a back plan view of the thermostat 82 usable with the wall mountable connector 84 of FIG. 23, with particular dimensions annotated. For example, $D_7$, which indicates a spacing between a first column of pins 280 and a second column of pins 282 may be about the same as the $D_1$ spacing shown on FIG. 23. Similarly, $D_8$, which indicates a spacing between an uppermost pin 280 or 282 and a top edge 284 of the recess 90, may be about the same as the $D_5$ spacing shown on FIG. 23. $D_9$, which indicates a spacing between a lowermost pin 280 or 282 and a bottom edge 286 of the recess 90, may be about the same as the $D_6$ spacing shown on FIG. 23. $D_7$ may range from 30 mm to 60 mm. In some instances, $D_7$ may range from 40 mm to 50 mm. In some instances, $D_7$ may be about 44.5 mm. $D_8$ may be less than about 8 mm. $D_8$ may be between about 4.5 mm and about 6.5 mm. $D_9$ may be about 18 mm or less. In some cases, $D_9$ may be between about 14.5 mm and about 16.5 mm.

In some cases, it may be useful to describe the position of the first column of pins 280 and the second column of pins 282 relative to an outer edge of the recess 90 formed in the thermostat 82. With reference to FIG. 24, the recess 90 may be considered as having a left edge 281 and a right edge 284. In some cases, the first column of pins 280 may be spaced from the left edge 281 a distance that is labeled as $D_{10}$. It will be appreciated that the second column of pins 282 may be spaced from the right edge 283 a distance equal to $D_{10}$. In some cases, $D_{10}$ may be between about 3 mm and about 20 mm. $D_{10}$ may be between about 4 mm and about 12 mm. $D_{10}$ may be between about 5 mm and about 8 mm. In some cases, $D_{10}$ may be about 6 mm.

The first column of pins 280 in FIG. 24 may be substantially parallel with the second column of pins 282. In some cases, the first column of pins 280 may be substantially vertically aligned with the second column of pins 282. As illustrated, the first column of pins 280 and the second column of pins 282 may be vertically closer to the top edge 284 of the recess 90 than to the bottom edge 286. Accordingly, and in comparison with FIG. 23, it will be appreciated that the thermostat 82 will only fit onto the wall mountable connector 84 in a single orientation. One can't accidently mount the thermostat 82 upside down or sideways, for example. It is contemplated that these mechanical alignment and fitment features may be carried out through a line of compatible thermostats.

Figure 26:
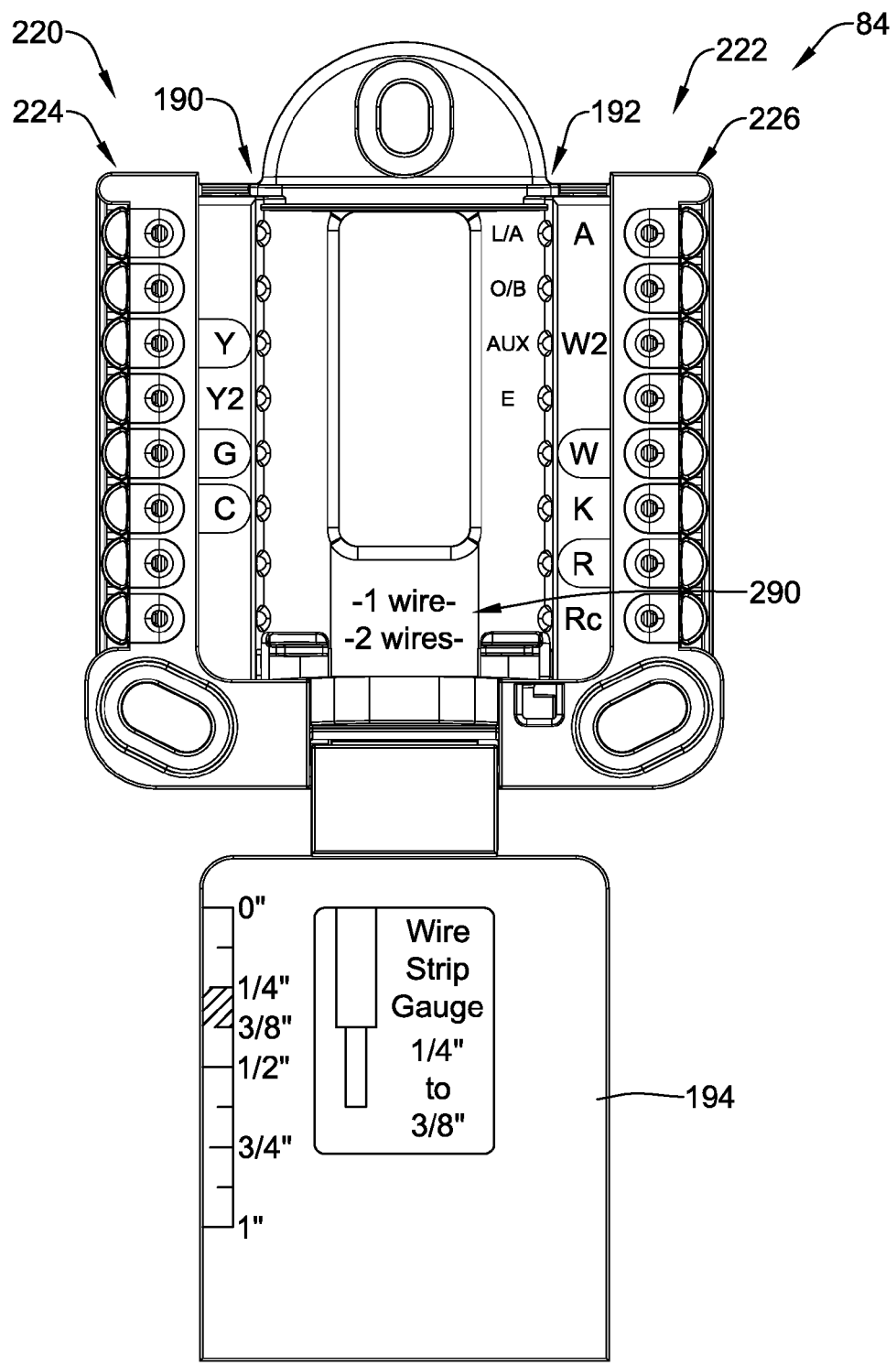
FIG. 26 is a front view of the wall mountable connector with the door in the open position, indicating relative terminal positions in a wall mountable connector utilizing fewer labeled terminals.

FIGS. 25 and 26 are front plan views of the wall mountable connector 84, showing the door 194 attached but in an open position in which the door 194 does not block access to the interior of the wall mountable connector 84. As can be seen, some of the wiring terminals are arranged so that more commonly used wiring terminals are spaced apart in order to provide additional finger space for inserting particular field wires. Also, the wiring terminals are labeled in an easy to read manner. In some cases, some of the more popular wiring terminals are labeled in a bolder font, such as in bold or in inverse to make it even easier for someone to find them. Conversely, some of the less commonly used wiring terminals are labeled in a smaller font.

In some cases, a wiring block such as the first wiring connection block 190, may include two or more commonly used wiring terminals. The more commonly used wiring terminals may include, for example, an R terminal (power, typically 24 volts), a W terminal (Heat), a G terminal (Fan) and a Y terminal (Cool). At least some of these wiring terminals are separated from each other by at least one intervening wiring terminal. For example, the first wiring connection block 190 may include a Y terminal and a G terminal that are separated by at least one intervening terminal. As illustrated, the Y terminal and the G terminal are separated by a $Y_2$ terminal (e.g. second stage cooling). In some cases, the first wiring connection block 190 may also include a C terminal (common), as illustrated. In some instances, a wiring block such as the second wiring connection block 192 may include two or more of the commonly used wiring terminals that were not utilized in the first wiring connection block 190. For example, in some cases, the second wiring connection block 192 may include a W terminal and an R terminal, separated from each other by at least one intervening terminal. As illustrated, the W terminal and the R terminal are separated by a K terminal. In some cases, an O/B wiring terminal, indicating a heat pump, only has one designation.

Figure 27:
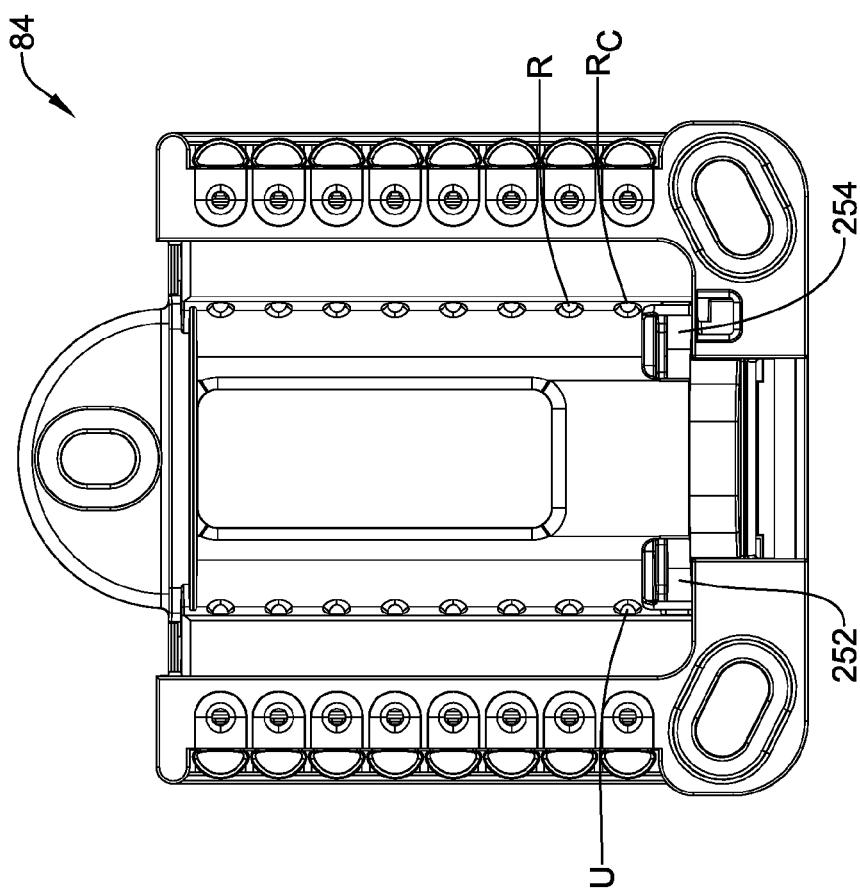
FIG. 27 is a front view of the wall mountable connector with the door removed, illustrating jumper functionality.

FIG. 27 is a front view of the wall mountable connector 84 with the door 194 removed. With reference to FIG. 22, certain wire terminals including the R wiring terminal, the $R_C$ wiring terminal and the U wiring terminal relative to the lead frame 248, the U terminal slider 252 and the R terminal slider 254 are identified. In some cases, there may be two U wiring terminals. The R wiring terminal may be intended for electrically connecting a field wire from a heat transformer. The $R_C$ wiring terminal may be intended for electrically connecting a field wire from a cool and/or fan transformer. The U wiring terminal may be intended for electrically connecting a field wire from an accessory transformer (e.g. humidifier). In some cases, depending on what HVAC equipment is being controlled by the thermostat 82, there may be a desire to electrically couple the R wiring terminal and the $R_C$ wiring terminal (e.g. only a heat transformer is present). In some cases, there may be a desire to electrically couple the U wiring terminal and the $R_C$ wiring terminal (e.g. a cooling transformer is present, but no accessory transformer).

Accordingly, the wall mountable connector 84 may be configured to provide easy jumper functionality. In some cases, the R terminal slider 254 and a portion of the lead frame 248, as will be discussed, may, in combination, be considered as functioning as a R switch that is manually movable between a closed position in which the R switch electrically connects the R wiring terminal and the $R_C$ wiring terminal, and an open position in which the R switch electrically disconnects the R wiring terminal and the $R_C$ wiring terminal. In some cases, the U terminal slider 252 and a portion of the lead frame 248, as will be discussed, may, in combination be considered as functioning as a U switch that is manually movable between a closed position in which the U switch electrically connects the $R_C$ wiring terminal and the U wiring terminal, and an open position in which the U switch electrically disconnects the $R_C$ wiring terminal and the U wiring terminal.

In some instances, an installer may determine the presence or absence of a heat transformer, a cooling or fan transformer, and an accessory transformer. The installer may then set the R switch and the U switch accordingly. In some cases, and with brief reference to FIG. 25, a label 290 may indicate which direction to slide the R terminal slider 254 in order to close the R switch and/or which direction to slide the U terminal slider 252 in order to close the U switch. For example, the installer may close the R switch if it is determined that there is a single HVAC transformer for heating and cooling, and one side of the single transformer is wired to the R wiring terminal. The installer may open the R switch if there is a heating transformer for heating and a separate cooling transformer for cooling, and one side of the heating transformer is wired to the R wiring terminal and one side of the cooling transformer is wired to the $R_C$ wiring terminal. In some cases, the installer may open the U switch if an accessory uses its own transformer, and one side of the accessory transformer is wired to the U wiring terminal. The U switch may be closed, however, if an accessory is configured to utilize the heating or cooling transformer.

Figure 28:
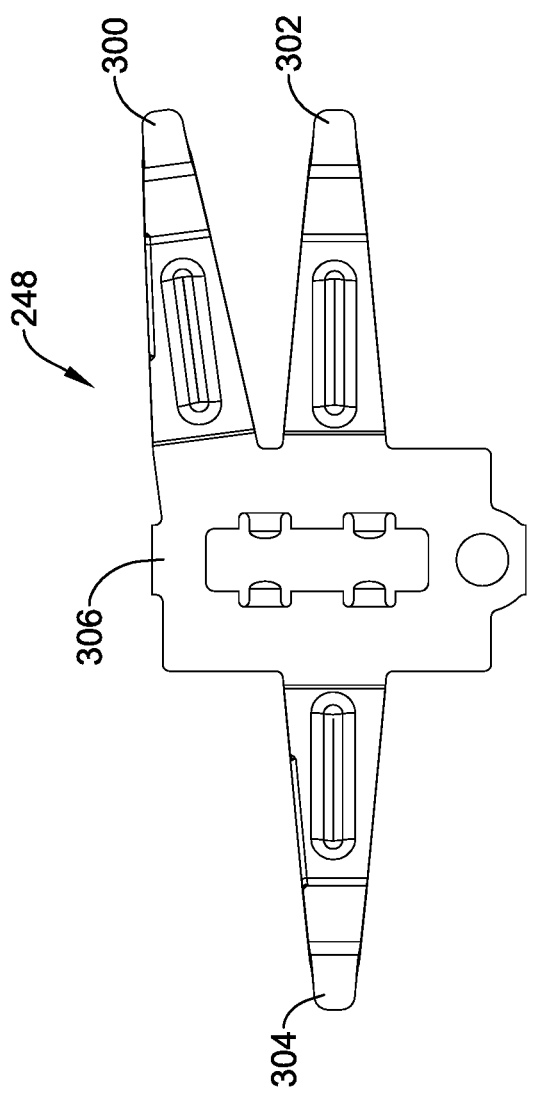
FIG. 28 is a view of the lead frame or conductive switch shown in FIG. 22.

FIG. 28 provides an enlarged view of the lead frame 248 visible in FIG. 22. The lead frame 248 may be considered as including an R leg 300, an $R_C$ leg 302 and a U leg 304. The lead frame 248 includes a central mounting portion 306 which may be secured to the back housing portion 180*b*. The R leg 300 may be considered as radiating outward from the central mounting portion 306. The $R_C$ leg 302 may be considered as radiating outward from the central mounting portion 306. The U leg 304 may be considered as radiating outward from the central mounting portion 306.

As the lead frame 248 may be stamped out of a single piece of conductive material, such as a metal, it will be appreciated that the R leg 300, the $R_C$ leg 302 and the U leg 304 are all electrically connected together. The R leg 300 and the $R_C$ leg 302 may, for example, be considered as being part of the aforementioned R switch while the U leg 304 may be considered as being part of the aforementioned U switch. In some cases, the R leg 300 may be moveable via the R terminal slider 254 between a closed position in which the R leg 300 is electrically coupled with the R wiring terminal and an open position in which the R leg 300 is not electrically coupled with the R wiring terminal. In some instances, the $R_C$ leg 302 remains electrically coupled with the $R_C$ wiring terminal. In some cases, the U leg 304 may be moveable via the U terminal slider 252 between a closed position in which the U leg 304 is electrically coupled with the U wiring terminal and an open position in which the U leg 304 is not electrically coupled with the U wiring terminal.

Figure 29:
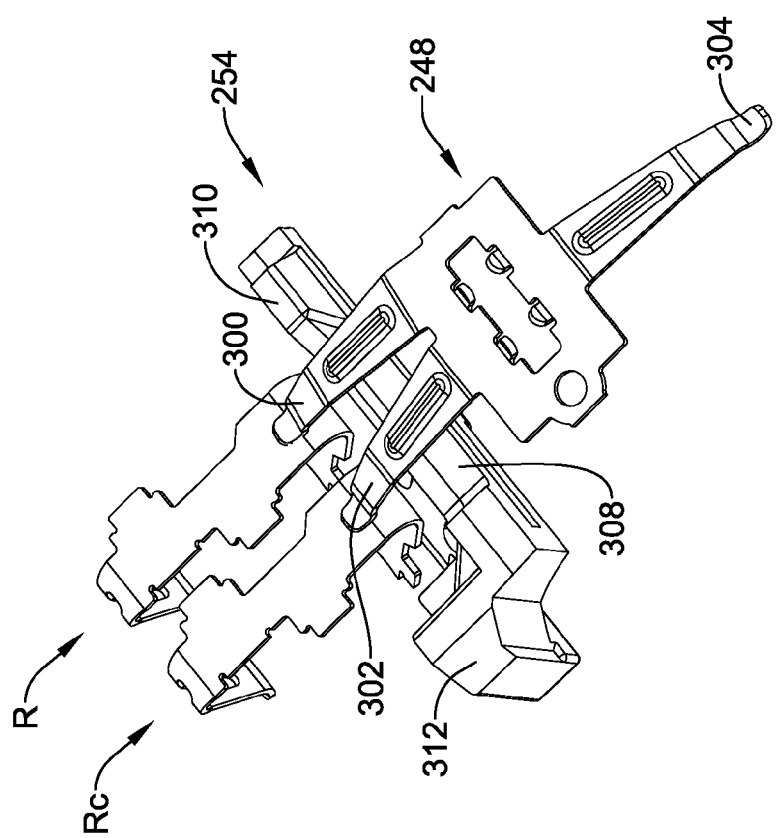
FIG. 29 illustrates a relationship between an R slider and the lead frame of FIG. 28.

In some cases, the U terminal slider 252 includes a cam 314 (shown in phantom in FIG. 22) that lifts the U leg 304 out of contact with the U wiring terminal when the U leg is in the open position. In some cases, the R terminal slider 254 includes a cam that lifts the R leg 300 out of contact with the R wiring terminal when the R leg is in the open position. FIG. 29 provides further detail regarding the R terminal slider 254, disposed relative to the lead frame 248, the R wiring terminal and the $R_C$ wiring terminal. The illustrative R terminal slider 254 includes a central track portion 308 that is configured to slidingly engage the housing of the wall mountable connector 84. A cam portion 310 extends in a first direction from the central track portion 308 and is configured to lift the R leg 300 out of electrical contact with the R wiring terminal when the R terminal slider 254 is moved to the open position. A body portion 312 extends in a second direction from the central track portion 308 and is configured to provide a handle for engaging the R terminal slider 254 and in some cases is configured to physically block access to the $R_C$ wiring terminal when the R terminal slider 254 is in the closed position, thereby preventing the installer from inadvertently connecting a heating transformer to a cooling transformer.

Figure 30:
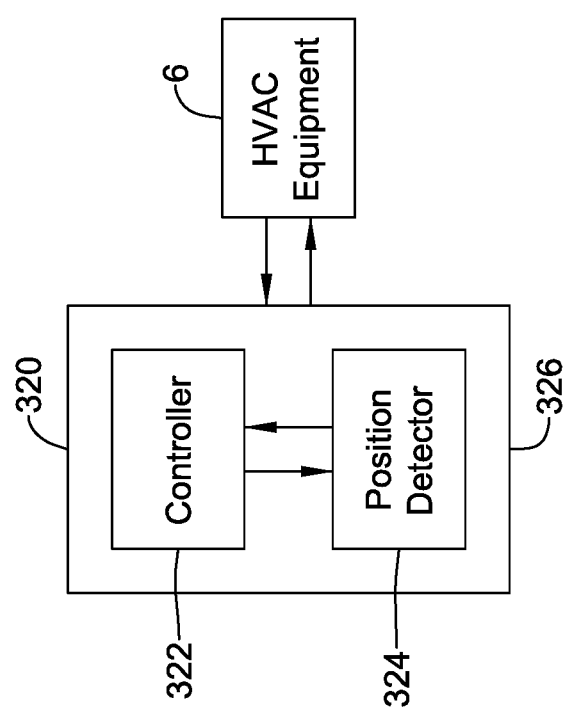
FIG. 30 is a schematic block diagram of a thermostat configured to determine the position of a jumper switch located in the wall mountable connector.

FIG. 30 is a schematic block diagram of a thermostat 320 that is configured to be used in combination with a wall mountable connector, such as the wall mountable connector 84, which has a jumper switch such as the R switch and/or the U switch previously discussed. The thermostat 320 is configured to be releasably secured to a wall mountable connector that is itself configured to be secured to a wall and provide electrical connections between the thermostat 320 and the HVAC equipment 6 (FIG. 1) that is to be controlled by the thermostat 320. The illustrative thermostat 320 includes a controller 322 that is disposed within a housing 326 and is configured to be operatively coupled to a plurality of pin terminals (not shown) of the thermostat 320. In some cases, the plurality of pin terminals may include the pins 280 and 282 (e.g. see FIG. 24). A jumper switch position detector 324 may be configured to inform the controller 322 as to whether the jumper switch (e.g. R terminal slider 254) of the wall mountable connector 84 is in a first position or a second position, as previously discussed. In some cases, the controller 322 may be configured to change the control of at least some functionality of either the thermostat 320 and/or the HVAC equipment 6 in accordance with whether the jumper switch is in the first position or in the second position. In some cases, the first position of the jumper switch corresponds to the jumper switch being in an open position in which the jumper switch does not electrically connect the R wire terminal and the $R_C$ wire terminal. In some cases, the second position of the jumper switch corresponds to the jumper switch being in a closed position in which the jumper switch does electrically connect the R wire terminal and the $R_C$ wire terminal.

Figure 31:
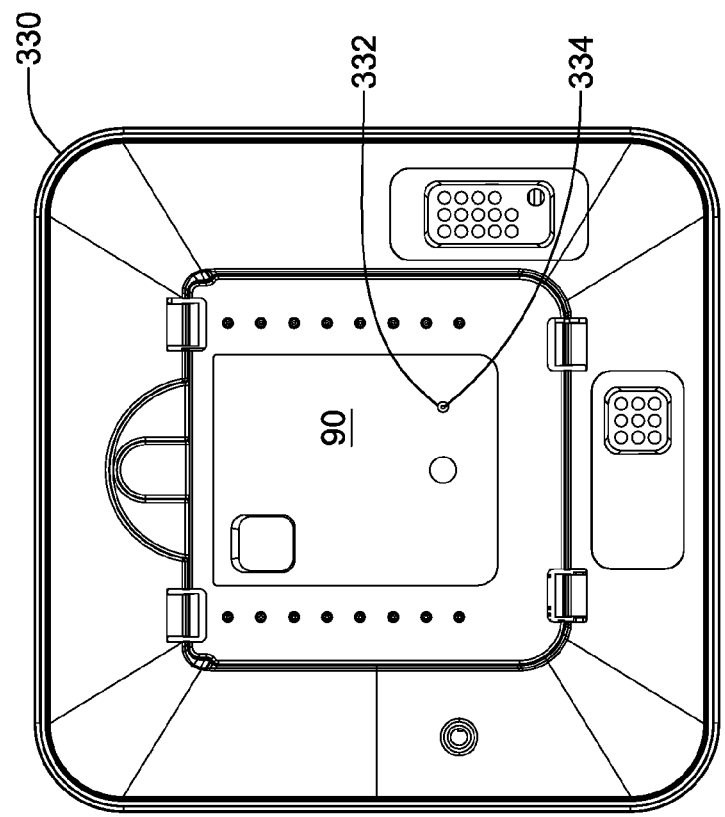
FIG. 31 is a back view of a thermostat including a plunger-style jumper switch position detector.
Figure 32:
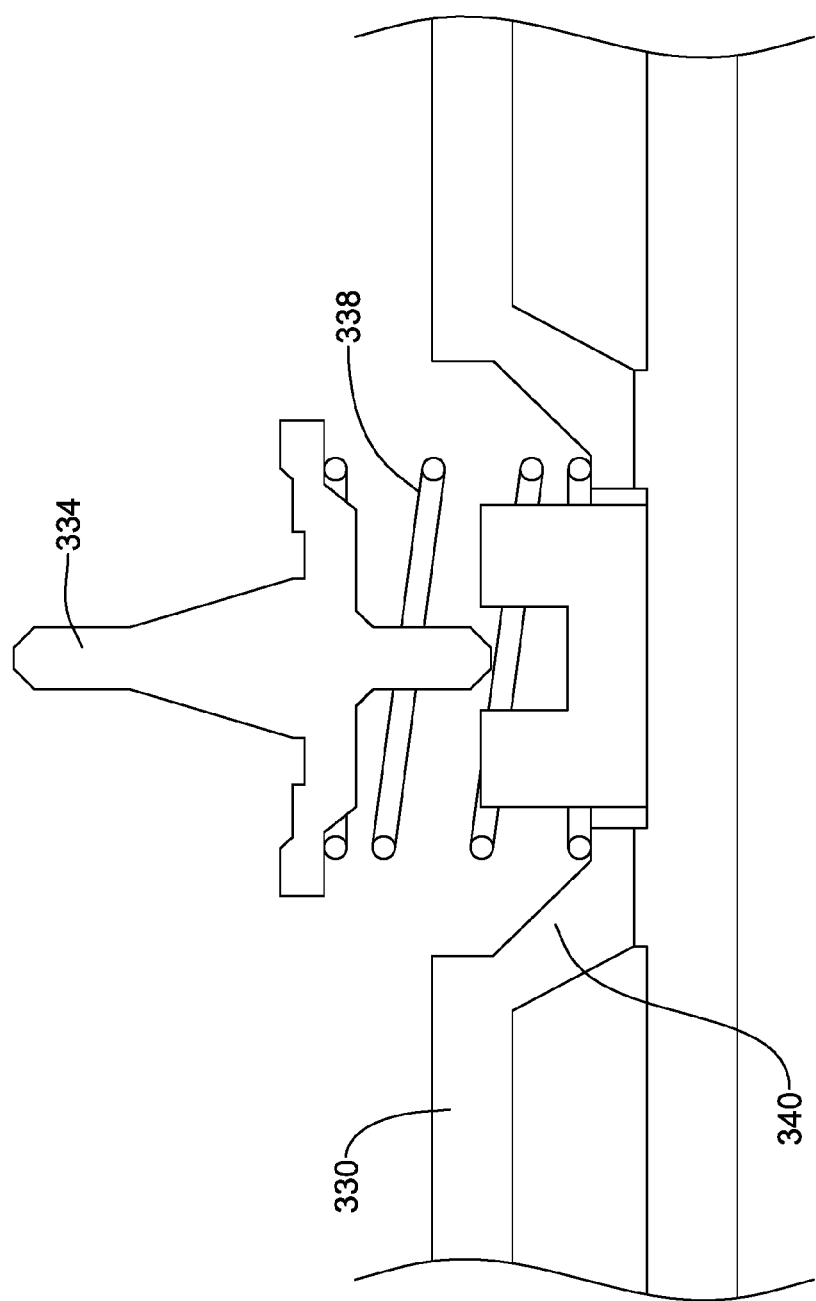
FIG. 32 is a closer view of the plunger-style jumper switch position detector of FIG. 31.

FIG. 31 is a back view of an illustrative thermostat 330 that includes a plunger-style jumper switch position detector. The thermostat 330 includes an aperture 332 that accommodates a plunger 334 that extends out of the back of the thermostat 330. In some cases, the plunger 334 is arranged to align with an aperture 336 (see FIG. 17) that is blocked when the R terminal slider 254 is in an up position and is open when the R terminal slider 254 is in a down position. If the plunger 334 is able to extend into the aperture 336, the thermostat 330 then can detect that the R terminal slider 254 is in the down (e.g. closed) position. If the plunger 334 is not able to extend into the aperture 336, the thermostat 330 determines that the R terminal slider 254 is in the up (e.g. open) position. As seen in FIG. 32, the plunger 334 may be biased to an extended position via a spring 338. In some cases, if the plunger 334 is extended, a light beam provided within an optical interrupter 340 is not interrupted while if the plunger 334 is not extended the light beam is interrupted. The optical interruption may then be detected.

Figure 33:
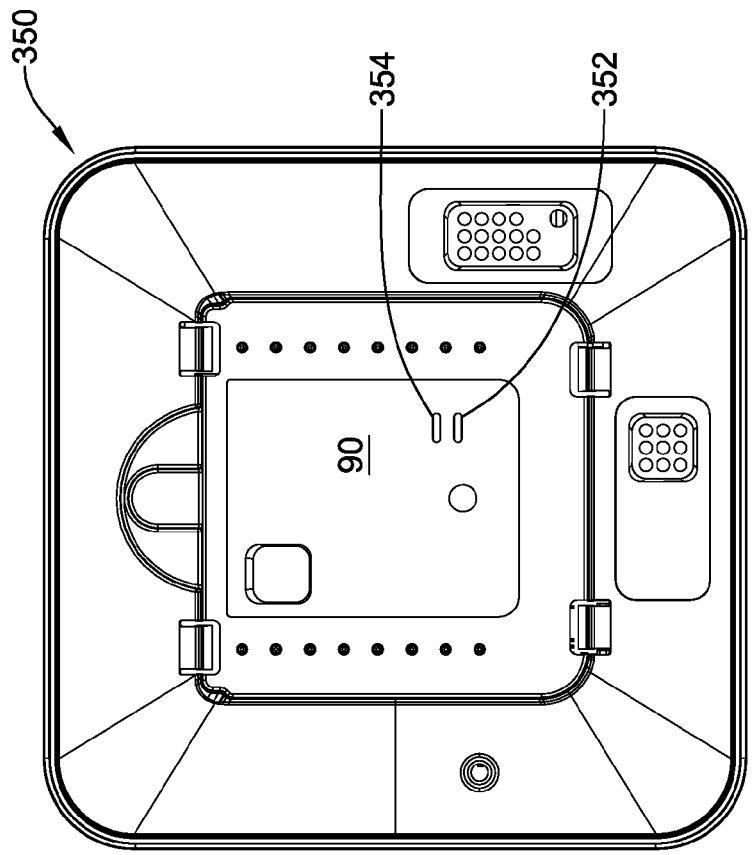
FIG. 33 is a back view of a thermostat including a photo-eye style jumper switch position detector.
Figure 34A:
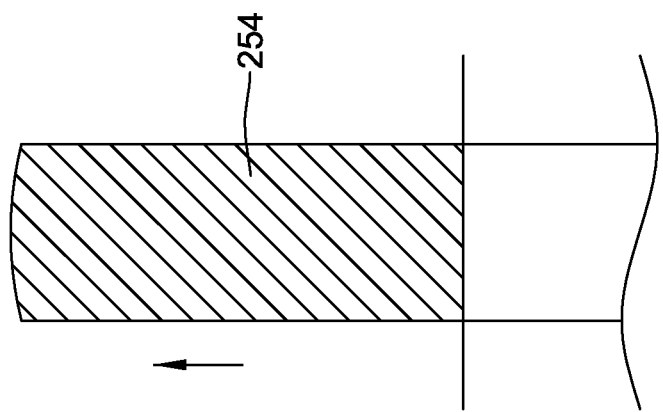
FIGS. 34A and 34B are schematic illustration of the jumper switch in an open position and a closed position, respectively.
Figure 34B:
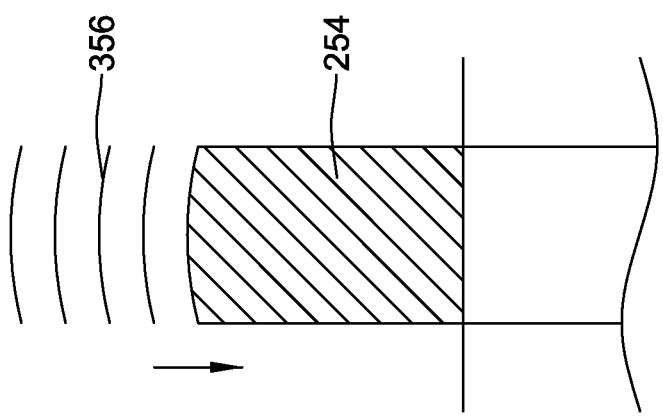

FIG. 33 is a back view of another illustrative thermostat 350 that includes a photo-detector type jumper switch position detector. The illustrative thermostat 350 includes a first photo detector 352 and a second photo detector 354. As can be seen in FIG. 34A, which shows an illustrative R terminal slider 254 in a down position, the R terminal slider 254 itself has a first optical pattern represented by diagonal cross-hatching in FIG. 34A. An area 356 of the wall mountable connector housing proximate the R terminal slider 254 may have a second optical pattern represented by horizontal cross-hatching. When the jumper (e.g. R terminal slider 254) is in a first position, as represented by FIG. 34A, the first photo detector 352 sees the first optical pattern on the R terminal slider 254 while the second photo detector 354 sees the second optical pattern on the wall mountable connector housing in area 356. When the jumper (e.g. R terminal slider 254) is in a second position, as represented by FIG. 34B, the first photo detector 352 and the second photo detector 354 both see the first optical pattern on the R terminal slider 254. A controller of the thermostat 350, which is coupled to the first photo detector 352 and the second photo detector 354, may then determine the position of the jumper (e.g. R terminal slider 254) of the wall mountable connector 84 based on the detected optical patterns.

Figure 35:
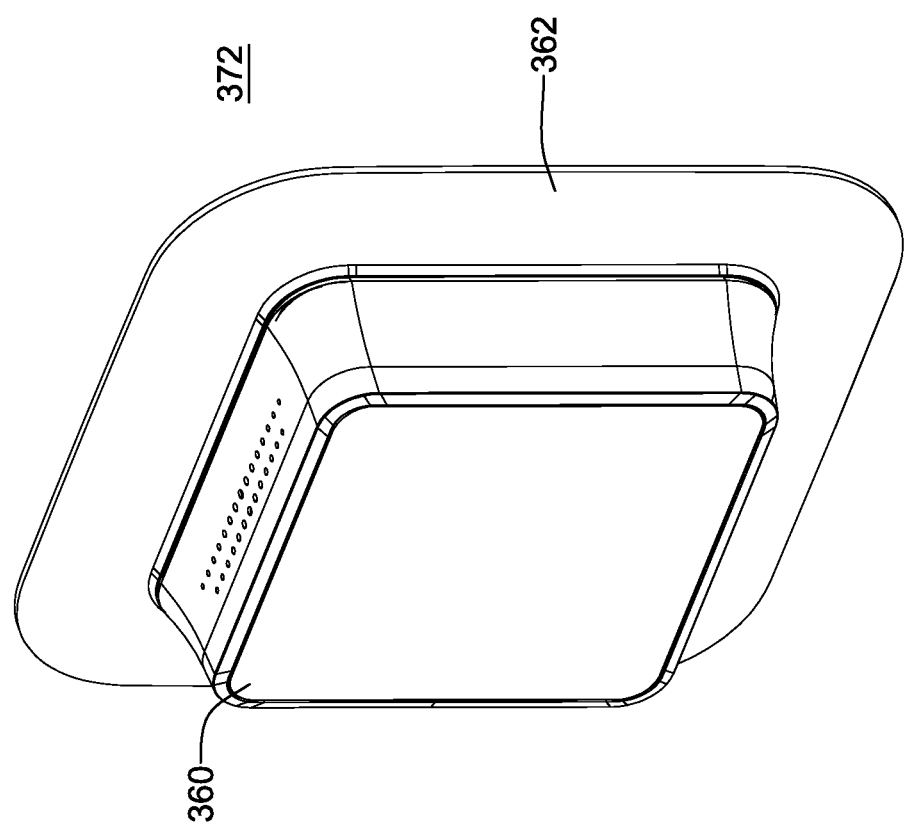
FIG. 35 is a perspective view of a thermostat in combination with a flexible wall covering plate.
Figure 36:
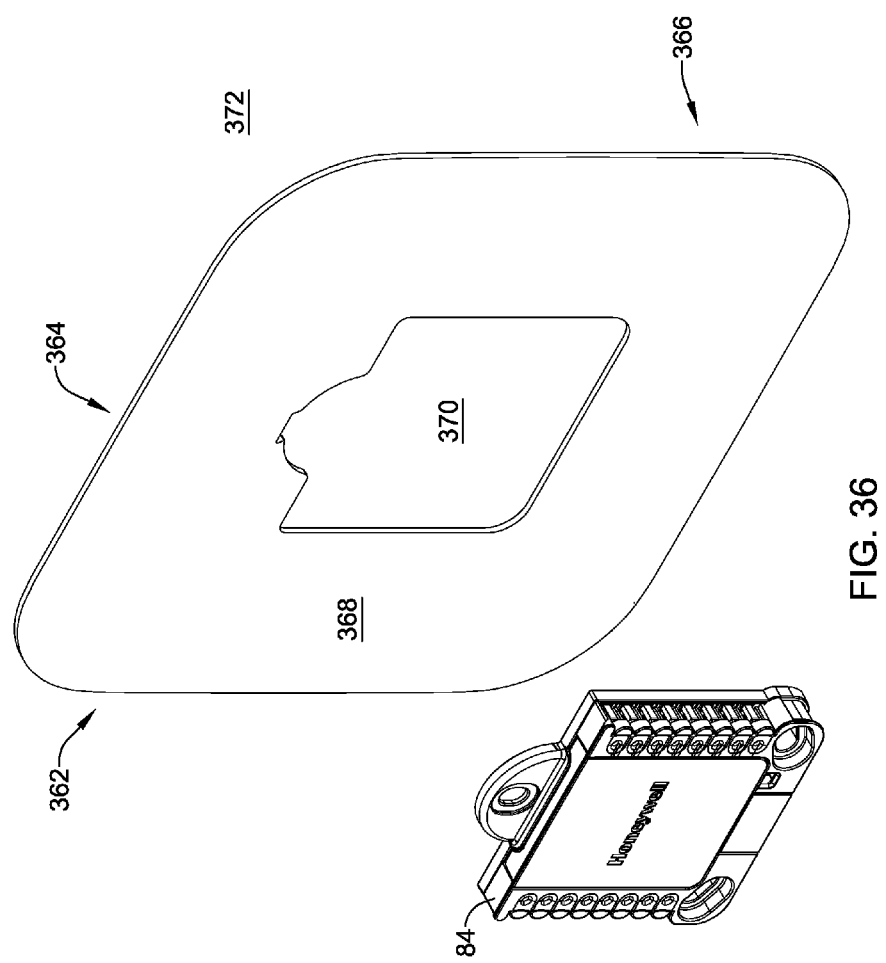
FIG. 36 shows an exploded view of the wall mountable connector and the flexible wall covering plate of FIG. 35.

FIG. 35 is a perspective view of an illustrative thermostat 360 shown in position relative to an illustrative wall covering plate 362. In some cases, the thermostat 360 may be securable to a wall mountable connector 84. The wall covering plate 362 may be secured to the wall 372 around the wall mountable connector 84, as shown in FIG. 36. The illustrative wall covering plate may include a substrate 364 having a back surface 366 that is configured to be secured to a wall 372 and an opposing front surface 368. An opening 370 may be formed through the substrate 364 that is configured to fit around the wall mountable connector 84, meaning that the wall covering plate 362 may be secured to the wall 372 even after the wall mountable connector 84 has been mounted to the wall 372. In some cases, the substrate 364 is thin enough to fit between the wall 372 and a back surface of a connected thermostat, such as the thermostat 360, without interfering with any electrical and/or mechanical connections between the wall mountable connector 84 and the thermostat 360. In some cases, the wall covering plate 362 may have a thickness that ranges from about 0.2 mm to about 0.5 mm, at least in the region that falls between the wall 372 and the thermostat 360. As can be seen in FIG. 35, for example, the wall covering plate 362 may have a length and/or a width that is larger than corresponding dimensions of the thermostat 360 such that the wall covering plate 362 may cover wall blemishes or the like.

Figure 37A:
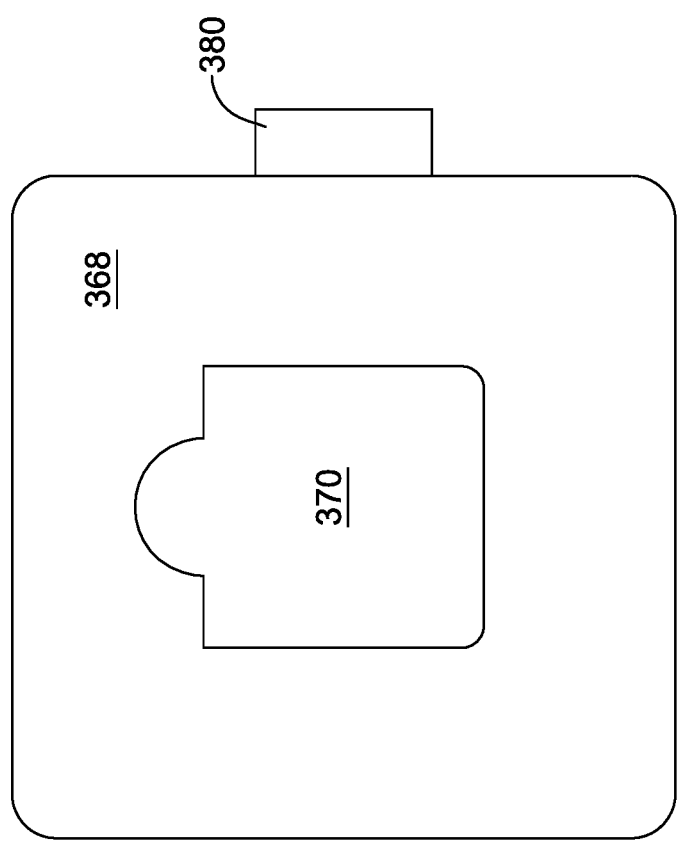
FIGS. 37A-37C show aspects of the flexible wall covering plate of FIG. 35.
Figure 37B:
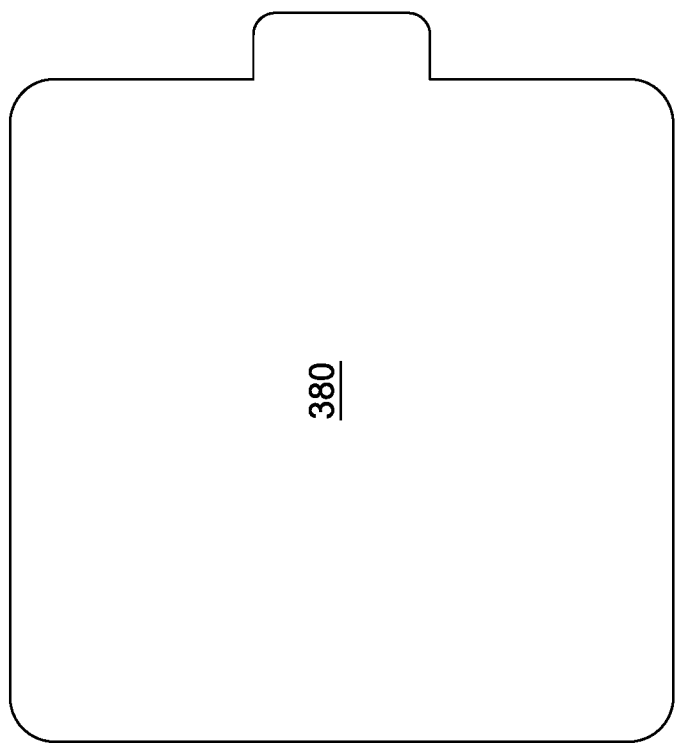
Figure 37C:
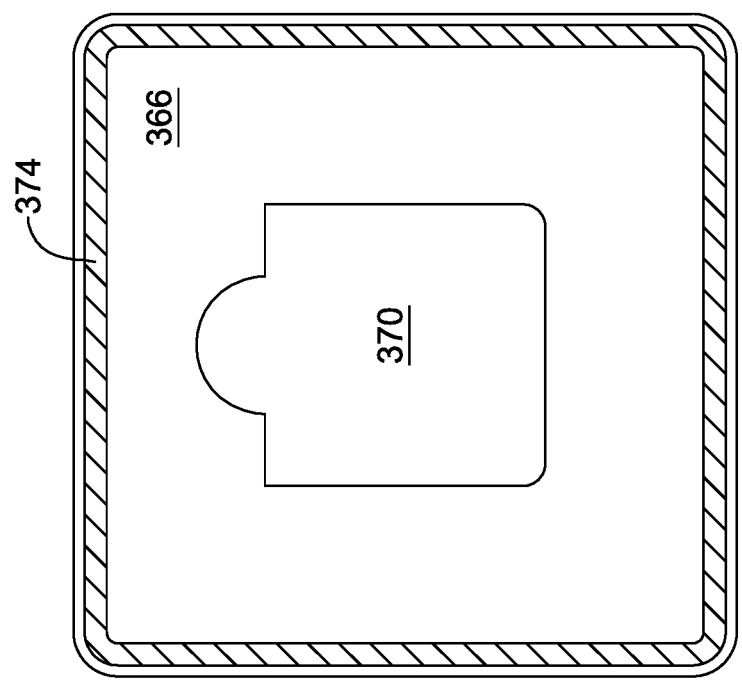

In some cases, as seen in FIGS. 37A-37C, the wall covering plate 362 may include an adhesive layer 374 that is disposed on the back surface 366. In some cases, the adhesive layer 374 may follow a perimeter of the back surface 366, but this is not required. If an adhesive layer 374 is present, a backer layer 380 may be disposed over the back surface 366 and the adhesive layer 374 to protect the adhesive layer 374 until installation. In other cases, no adhesive is used, and instead the wall covering plate 362 may form a frictional fit with the wall mountable connector 84. In some cases, the wall covering plate 362 may simply be captured between the wall 372 and a back of the thermostat 360. In some cases, the substrate 364 may be polymeric. In some cases, the substrate 364 may be flexible.

Figure 38:
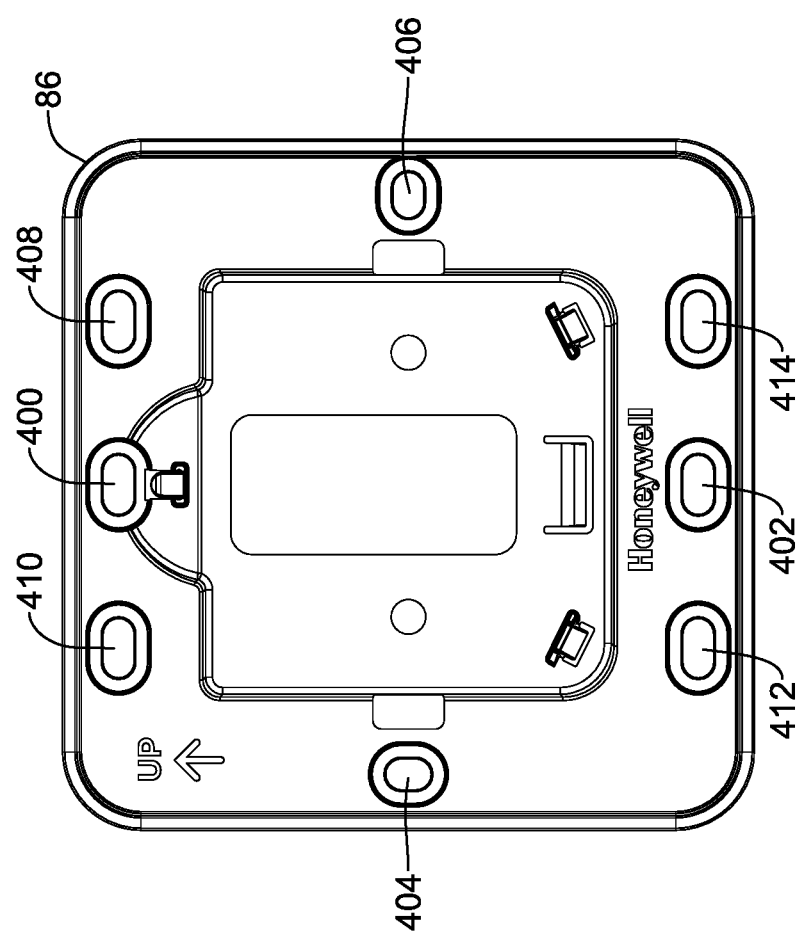
FIG. 38 is a front view of the adapter plate.

FIG. 38 is a front view of the adapter plate 86, illustrating how inclusion of a plurality of junction box mounting apertures provide flexibility in securing the adapter plate 86 to a variety of different junction box configurations. For example, mounting apertures 400 and 402 may be used to secure the adapter plate 86 to a single-wide junction box that is situated in a vertical orientation. For securing the adapter plate 86 to a single-wide junction box that is situated in a horizontal orientation (probably less likely than the vertical orientation), mounting apertures 404 and 406 may be utilized. For securing the adapter plate 86 to a double-wide (or square) junction box, mounting apertures 408, 410, 412 and 414 may be used. By providing these various mounting apertures, a single adapter plate 86 may be used in a variety of different installations.

Figure 39:
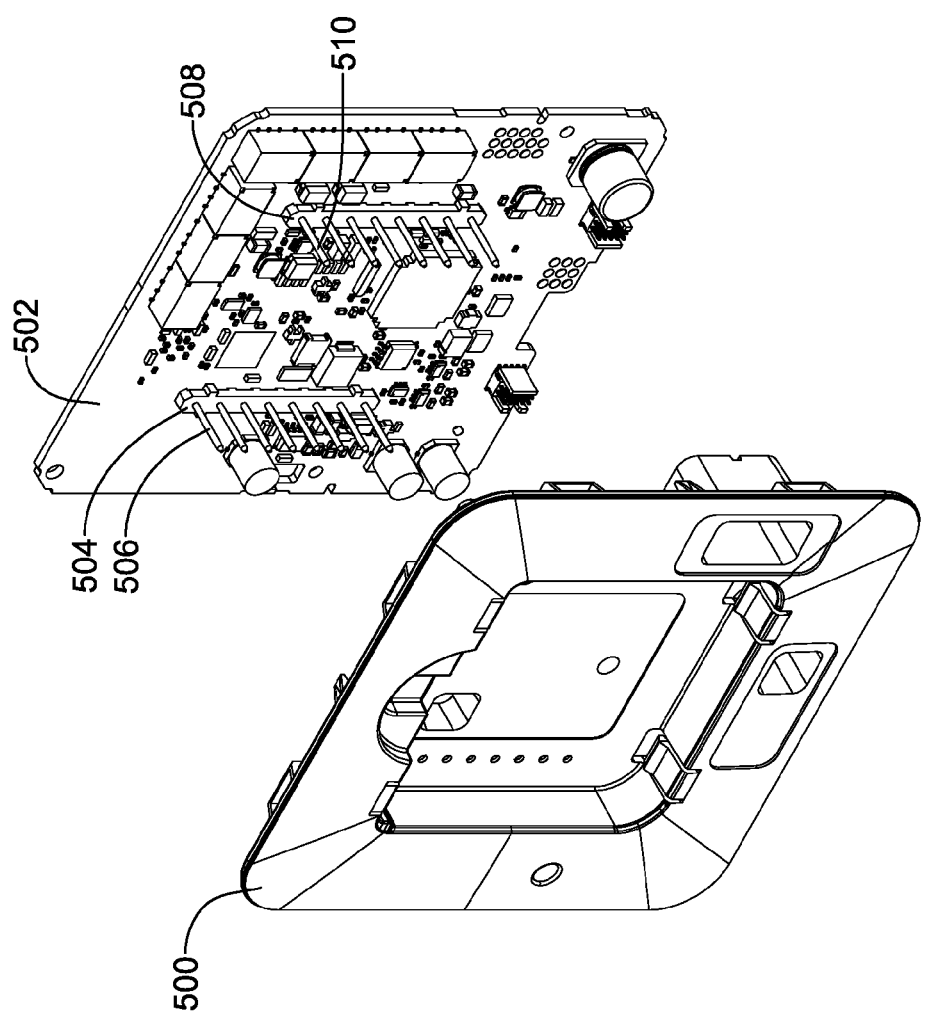
FIG. 39 is a rear exploded perspective view of a thermostat housing and printed circuit board.
Figure 40:
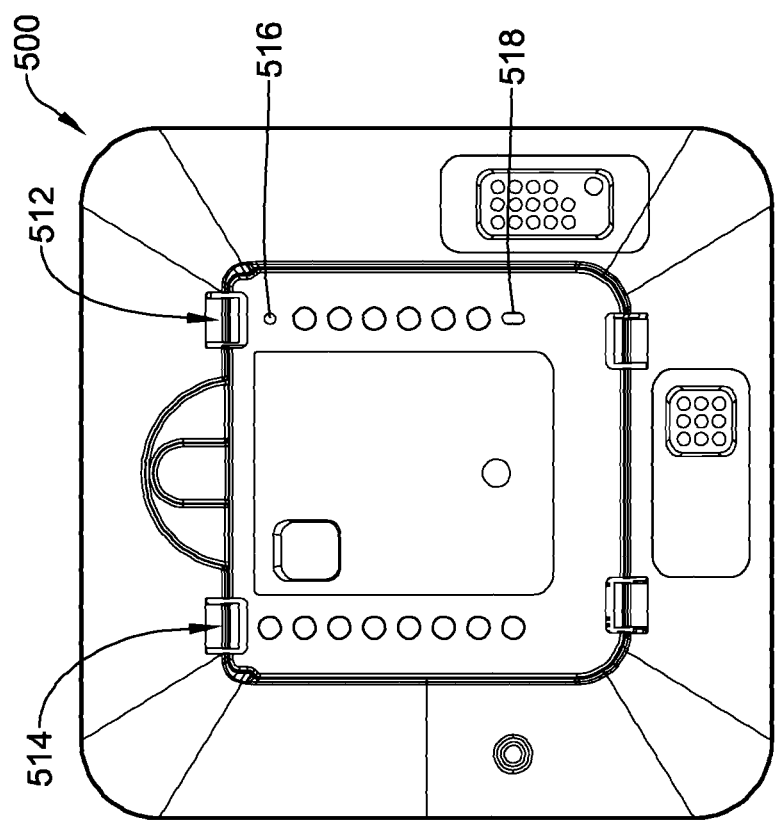
FIG. 40 is a rear view of the assembled thermostat housing and printed circuit board of FIG. 39.

FIGS. 39 and 40 illustrate efficiently locating a printed circuit board within a thermostat via alignment of the pins extending from the printed circuit board and through apertures within a rear surface of the thermostat. FIG. 39 is an exploded rear perspective view of an illustrative thermostat housing 500 in combination with a printed circuit board 502, while FIG. 40 shows a back view of the assembly. The printed circuit board 502 includes a first pin header 504 and a first row 506 of terminal pins that are disposed in the first pin header 504. The illustrative printed circuit board 502 also includes a second pin header 508 and a second row 510 of terminal pins that are disposed in the second pin header 508. As seen in FIG. 40, the thermostat housing 500 includes a first row of apertures 512 that are configured to accommodate the first row 506 of terminal pins and a second row of apertures 514 that are configured to accommodate the second row 510 of terminal pins.

In some cases, the first row of apertures 512 may include a lateral alignment aperture 516 that is configured to provide a tighter fit with a corresponding one of the first row 506 of terminal pins in order to provide a lateral alignment of the printed circuit board 502 relative to the thermostat housing 500. In some cases, the lateral alignment aperture 516 may have a smaller dimension (e.g. diameter) than other of the apertures. In some cases, the first row of apertures 512 may include a rotational alignment aperture 518. In some instances, the rotational alignment aperture 518 may have a narrowed dimension in a first dimension (e.g. left-right) and a wider dimension in an orthogonal direction (e.g. up-down). In some cases, the rotational alignment aperture 518 may be oblong or elliptical in shape. The rotational alignment aperture 518 may be configured to provide a tighter fit with another of the first row 506 of terminal pins in order to provide a rotational alignment of the printed circuit board 502 relative to the thermostat housing 500.

In some cases, the wider dimension in the orthogonal direction may reduce stress applied to the corresponding terminal pin when assembling the printed circuit board 502 with the thermostat housing 500 and/or during subsequent use. In some cases, the remainder of the first row of apertures 512, apart from the lateral alignment aperture 516 and the rotational alignment aperture 518, may be dimensioned looser, relative to a diameter of the terminal pins, in order to reduce stress during assembly and/or use. Thus, in some cases, the remainder of the first row of apertures 512 and/or the second row of apertures 514, may have diameters that exceed the diameters of the terminal pins. In some cases, as illustrated, the lateral alignment aperture 516 may be located at the top of the first row of apertures 512 while the rotational alignment aperture 518 may be located at the bottom of the first row of apertures 512. In some instances, the lateral alignment aperture 516 and/or the rotational alignment aperture 518 may be located in other positions with the first row of apertures 512 and/or the second row of apertures 514.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A wall mountable connector assembly comprising:
an adapter plate configured to be secured relative to a wall, the adapter plate further configured to accommodate a plurality of field wires exiting the wall;
a wall mountable connector having a first side for facing the wall and a second opposing side, the wall mountable connector configured to be secured to the adapter plate with the first side of the wall mountable connector positioned adjacent the adapter plate, the wall mountable connector including a field wiring connection block that is configured to provide an electrical connection to the plurality of field wires and a thermostat terminal block that is configured to provide an electrical connection to a thermostat to be connected to the wall mountable connector; and
a wall covering plate having a front side and a back side with a wall mountable connector aperture extending from the front side to the back side that is sized to accommodate the wall mountable connector therethrough in order to allow the wall covering plate to be slipped over the second opposing side of the wall mountable connector and down to the adapter plate while the wall mountable connector is secured to the adapter plate, wherein the wall covering plate is configured to be secured to the adapter plate.

2. The wall mountable connector assembly of claim 1, wherein the adapter plate is configured to be secured to an in-wall junction box, with the plurality of field wires extending through the in-wall junction box.

3. The wall mountable connector assembly of claim 1, wherein the adapter plate is configured to be secured directly to the wall over a wall aperture through which the plurality of field wires exit the wall.

4. The wall mountable connector assembly of claim 1, wherein the adapter plate comprises a raised portion that mirrors a perimeter of the wall mountable connector and raises the wall mountable connector a distance.

5. The wall mountable connector assembly of claim 4, wherein the adapter plate comprises one or more slots disposed proximate the raised portion, and the wall covering plate comprises one or more corresponding tabs that engage with the one or more slots to secure the wall covering plate to the adapter plate.

6. The wall mountable connector assembly of claim 1, wherein the wall covering plate is configured to be releasably securable to the adapter plate, such that the wall covering plate can be removed from the adapter plate, leaving the wall mountable connector in place.

7. The wall mountable connector assembly of claim 1, wherein the wall covering plate has a length and width sufficient to cover the adapter plate.

8. The wall mountable connector assembly of claim 1, wherein the wall covering plate has a rear portion that is configured to fit over the adapter plate.

9. The wall mountable connector assembly of claim 1, wherein the wall covering plate has a front recess that is sized to permit at least part of the thermostat to set into the front recess when the thermostat is connected to the wall mountable connector.

10. A wall covering plate for use in combination with a wall mountable connector that is mountable to an adapter plate, the wall covering plate configured to fit behind a thermostat that is connectable to the wall mountable connector, the wall covering plate comprising:
  a back portion that is sized and configured to fit over an adapter plate such that an outer perimeter of the back portion hides the adapter plate from view; and
  a wall mountable connector aperture formed through the wall covering plate, the wall mountable connector aperture extending through the back portion and sized and configured to fit around the wall mountable connector such that the wall mountable connector can extend through the wall mountable connector aperture such that the wall covering plate can be secured relative to the adaptor plate even after the wall mountable connector has been mounted to the adapter plate.

11. The wall covering plate of claim 10, wherein the back portion of the wall covering plate includes tabs that are configured to fit into corresponding slots disposed on either side of the adapter plate in order to secure the wall covering plate to the adapter plate.

12. The wall covering plate of claim 10, wherein the wall mountable connector aperture provides a frictional fit with the wall mountable connector in order to secure the wall covering plate in position against the wall.

13. The wall covering plate of claim 10, wherein the wall covering plate is secured in position against the wall at least in part by virtue of being captured between the wall and a back of the thermostat that is secured to the wall mountable connector.

14. The wall covering plate of claim 10, wherein the wall covering plate is rigid.

15. A mounting assembly for securing a thermostat to a wall, the mounting assembly comprising:
  an adapter plate configured to be secured relative to a wall, the adapter plate further configured to accommodate a plurality of field wires exiting the wall;
  a wall mountable connector configured to be secured to the adapter plate, the wall mountable connector including a field wiring connection block that is configured to provide an electrical connection to the plurality of field wires and a thermostat terminal block that provides an electrical connection between individual terminals of the field wiring connection block and a thermostat to be connected to the wall mountable connector; and
  a wall covering plate having a front side and a back side with a wall mountable connector aperture extending from the front side to the back side that is sized and configured to permit the wall mountable connector to pass through the wall mountable connector aperture to enable the wall covering plate to fit over the wall mountable connector and be secured to the adapter plate even after the wall mountable connector is secured to the adapter plate.

16. The mounting assembly of claim 15, wherein the adapter plate is configured to be secured to an in-wall junction box.

17. The mounting assembly of claim 15, wherein the adapter plate is configured to be secured directly to the wall.

18. The mounting assembly of claim 15, wherein the wall covering plate is releasably securable to the adapter plate, such that the wall covering plate can be removed from the adapter plate, leaving the wall mountable connector in place.

19. The mounting assembly of claim 15, wherein the wall covering plate has a length and width that are sized and configured to cover wall blemishes remaining from previous thermostat installations.

\* \* \* \* \*